United States Patent
Sakamoto et al.

(10) Patent No.: US 6,382,964 B2
(45) Date of Patent: May 7, 2002

(54) PROCESS AND APPARATUS FOR HEAT-TREATING SUBSTRATE HAVING FILM-FORMING COMPOSITION THEREON

(75) Inventors: Susumu Sakamoto, Dazaifu; Hiroshi Oshima; Hiroyuki Mori, both of Nagoya; Hironobu Ichihara, Kasugai; Yoji Sato, Aichi-ken, all of (JP)

(73) Assignees: Noritake Co., Ltd., Nagoya; Kyushu Noritake Co., Ltd., Asakura-gun, both of (JP)

( * ) Notice: Subject to any disclaimer, the term of this patent is extended or adjusted under 35 U.S.C. 154(b) by 0 days.

(21) Appl. No.: 09/861,711

(22) Filed: May 22, 2001

Related U.S. Application Data

(62) Division of application No. 09/425,974, filed on Oct. 25, 1999, which is a division of application No. 08/735,591, filed on Oct. 23, 1996, now Pat. No. 5,980,991.

(30) Foreign Application Priority Data

Oct. 26, 1995 (JP) .............................................. 7-279086
Jul. 31, 1996 (JP) .............................................. 8-202068

(51) Int. Cl.$^7$ ................................................. F27B 9/00
(52) U.S. Cl. ........................ 432/171; 432/121; 432/128
(58) Field of Search .......................... 432/80, 121, 128, 432/130, 133, 136, 163, 164, 171, 233; 427/374.1, 374.2, 374.3, 398.1, 444

(56) References Cited

U.S. PATENT DOCUMENTS

| | | |
|---|---|---|
| 3,389,458 A | 6/1968 | Ostrander et al. |
| 3,699,899 A | 10/1972 | Schiffmann et al. |
| 3,881,403 A | 5/1975 | Ingram et al. |
| 4,038,045 A | 7/1977 | Rammler et al. |
| 4,456,632 A | 6/1984 | Amberkar |
| 4,559,072 A | 12/1985 | Harcuba |
| 4,586,898 A | 5/1986 | Orbeck |
| 4,674,975 A | 6/1987 | Corato et al. |
| 4,687,895 A | 8/1987 | Chitre et al. |
| 4,886,449 A | 12/1989 | Brittin |
| 4,932,864 A | 6/1990 | Miyabe |
| 4,966,547 A * | 10/1990 | Okuyama et al. ............ 432/128 |
| 5,002,009 A | 3/1991 | Hayami et al. |
| 5,044,944 A * | 9/1991 | Furuya et al. ............... 432/128 |
| 5,443,382 A | 8/1995 | Tsurumi et al. |
| 5,443,383 A | 8/1995 | Kuehn |
| 5,673,901 A | 10/1997 | Heinrich |
| 5,674,304 A | 10/1997 | Fukada et al. |

* cited by examiner

Primary Examiner—Gregory Wilson
(74) Attorney, Agent, or Firm—Oliff & Berridge, PLC

(57) ABSTRACT

Firing process and apparatus for uniformly heat-treating a substrate having a film-forming composition thereon, wherein the substrate is subjected to a first soaking step in which the substrate is held for a predetermined time in a first heating chamber whose temperature is maintained at a first value, so that the temperature within the substrate is held at the first value evenly throughout an entire mass of the substrate, and after feeding of the substrate into a second heating chamber whose temperature is maintained at a predetermined second value which is different from the first value by a predetermined difference, the substrate is subjected to a second soaking step in which the substrate is held for a second predetermined time in the second heating chamber, so that the temperature within the substrate is held at the second value evenly throughout the entire mass of the substrate.

4 Claims, 13 Drawing Sheets

PROCESS AND APPARATUS FOR HEAT-TREATING SUBSTRATE HAVING FILM-FORMING COMPOSITION THEREON

This is a Division of application Ser. No. 09/425,974 filed Oct. 25, 1999, which in turn is a Division of application Ser. No. 08/735,591 filed Oct. 23, 1996 now U.S. Pat. No. 5,980,991. The entire disclosure of the prior application(s) is hereby incorporated by reference herein in its entirety.

BACKGROUND OF THE INVENTION

1. Field of the Invention

The present invention relates to a process and an apparatus for uniformly heat-treating a substrate which has a film-forming composition thereon.

2. Discussion of the Related Art

There are known substrates having films or layers formed thereon of a given material such as a metallic or inorganic material. In the present specification, the term "film" and the term "layer" are used interchangeably, unless otherwise specified. Such substrates include glass substrates made of a glass material, typically, a soda-lime glass, and ceramic substrates made of a ceramic material, typically, alumina. A film or layer, which has a certain function, may be bonded to the substrate by fusion or melting of a glass bonding component or by softening, melting or sintering of the material per se. These substrates may be used for anode plates for vacuum fluorescent displays (VFD), plasma switching boards for plasma address liquid crystal displays (PALC), field-emission displays (FED) and other display devices, thick-film wiring boards, and various electronic devices such as thermal printer heads and image sensors. Generally, the substrates for these electronic devices are subjected to heat treatments at temperatures of about 500–650° C. for the purpose of annealing the substrates per se or forming functional films with a glass material used as a bonding agent. Where the substrates are ceramic, the substrates are heat-treated at about 500–900° C. for forming functional films with a glass material used as a bonding agent or for forming functional films of a metallic material by utilizing the fusion of the metallic material at the interface with the substrates.

Recently, there have been increasing requirements for increasing the number of conductive, resistive, dielectric and other layers or films formed in desired patterns, and for increasing the density of such layers or films. Further, there has been an increasing demand for display devices having a large-sized display screen, and an accordingly increasing requirement for increasing the size of the substrates for such large-sized display devices. To meet these requirements, it is required to form minutely patterned layers or films over a comparatively large area, particularly, on the substrates for the display devices. The substrates for electronic devices described above have patterned functional films having minute cells or cavities. To assure high dimensional and positional accuracy of these minute cells, the functional films should be patterned with an improved degree of uniformity. However, the above heat treatment or firing of the substrates has an influence on the quality of the substrates, which influence increases as the size of the substrates increases. Therefore, the heat treatment causes a variation in the quality of the products using the substrates, and provides some restrictions in the design of the products, or reduces the yield of the products. The quality variation may be a variation in the resistance value of a resistor film, a variation in the withstand voltage of a dielectric film, a variation in the thickness due to uneven ratio of removal of binders by firing of the dielectric film, a variation in the continuity or resistance of a conductive film, a variation in the ease of wire-bonding or sputtering on the conductive film.

Where the substrate suffers from a dimensional change due to expansion or shrinkage of its material upon heat treatment, it is difficult to accurately position the patterned functional films relative to each other, since each function film is fired after it is formed in a predetermined pattern. The uniformity and positioning accuracy of the patterned films tend to be deteriorated with an increase in the density (minuteness) and size of the substrate, whereby the yield ratio of the product is significantly lowered as the density or size of the substrate is increased. In the case of a substrate for a plasma display device having a screen size as large as 40 inches, for example, the causes for lowering the yield ratio may include: insufficient dimensional accuracy of multiple layers which form multiple cells; variation in the height and width dimensions of partition walls; variation in the resistance of resistor cells; variation in the withstand voltage of a dielectric layer; an overall dimensional variation; and inaccurate positioning of front and rear plates which form a discharge cell.

SUMMARY OF THE INVENTION

The present invention was made in the light of the prior art drawbacks described above. It is therefore a first object of this invention to provide a process of firing a substrate with a film-forming composition provided thereon, which permits uniform heating of the substrate to thereby assure a high yield ratio of a product including the substrate.

It is a second object of the invention to provide a firing apparatus suitable for practicing the method indicated above.

The first object may be achieved according to a first aspect of the present invention, which provides a firing process of uniformly heat-treating a substrate having a film-forming composition thereon, comprising the steps of: (a) a first soaking step of holding, for a predetermined first time, said substrate in a first heating chamber whose temperature is maintained at a predetermined first value, so that the temperature within said substrate is held at said first value evenly throughout an entire mass of said substrate; (b) a feeding step of feeding said substrate subjected to said first soaking step, to a second heating chamber whose temperature is maintained at a predetermined second value which is different from said predetermined first value by a predetermined difference; and (c) a second soaking step of holding said substrate in said second heating chamber for a predetermined second time, so that the temperature within said substrate is held at said second value evenly throughout the entire mass of said substrate.

In the present firing process, the substrate having a film-forming composition is heat-treated by first subjecting the substrate to the first soaking step in the first heating chamber in which the substrate is held at the predetermined first temperature value for the predetermined first time for even distribution of the temperature throughout the entire mass of the substrate. Then, the substrate is fed into the second heating chamber whose temperature is maintained at the predetermined second value different from the first value by the predetermined amount, and is subjected to the second soaking step in which the substrate is held at the second value for the predetermined second time for even distribution of the temperature throughout the entire mass of the substrate. The substrate may be subjected to a further soaking step or steps. Thus, the substrate is heat-treated at different temperatures which are different from each other, so that a local variation in the temperature within the substrate and the film-forming composition is minimized. Where the substrate is formed of a glass material and is heat-treated at temperatures higher than the strain point of the glass material, a local dimensional variation or configurational deviation of the substrate can be minimized. Accordingly, the present firing process permits accurate positioning accuracy of films, layers or any other structural features subsequently formed on the substrate, resulting in a considerably increased yield ratio of the product which includes the substrate, even where the substrate has minute or intricate structural patterns or has a relatively large size. The film-forming composition provided on the surface of the substrate may be thick-film dielectric films, dielectric partition walls, thick-film resistor films, electrode films or inorganic pigment films. Since the present firing process makes it possible to minimize the local temperature variation within the substrate and within such films or layers formed thereon, a glass material contained in the films or layers as a bonding component may be uniformly melted or softened in the heat treatment process, and a metallic material or metal oxide contained in the films may be uniformly melted or sintered. Accordingly, the product has reduced variation in its properties such as withstand voltage, resistance value, discharge characteristics and optical filter characteristics and in its dimensions such as height and width dimensions of the partition walls. Consequently, the yield ratio of the product is significantly improved, even where the substrate has a large size. Further, the reduced variation in the resistance value results in a reduced cost of control of the production steps and elimination of some steps such as trimming step.

In the present process, the first and second temperature values are preferably determined to be close to the transition or strain point of a glass material contained in the substrate so that the temperature of the substrate changes through the transition or strain point while the temperature within the substrate is evenly distributed throughout the entire mass of the substrate. Where the films are bonded to the substrate by melting or sintering of a metallic or inorganic material, the first and second temperature values are preferably determined to be close to the melting or sintering point of the metallic or inorganic material so that the temperature of the substrate changes through the melting or sintering point while the temperature within the substrate is evenly distributed throughout the entire mass of the substrate.

In one preferred form of the first aspect of the invention, the firing process further comprises a first stand-by step which is implemented concurrently with the first soaking step, to adjust the temperature in the second heating chamber to the predetermined second value so that the second soaking step is implemented in the second heating chamber, and further comprising a second stand-by step which is implemented concurrently with the second soaking step, to adjust the temperature in the first heating chamber to a predetermined third value which is different from the predetermined second value by a predetermined difference, so that a third soaking step is implemented in the first heating chamber. In this case, the temperature in the second heating chamber is maintained at the second value while the first soaking step is implemented, and the temperature in the first heating chamber is maintained at the third value while the second soaking step is implemented. Accordingly, the second and third soaking steps may be initiated immediately after the termination of the first and second soaking steps, respectively.

In one advantageous arrangement of the above first preferred form of the firing process, the first stand-by step comprises a cooling step of lowering the temperature in the second heating chamber to a value lower than the predetermined second value by a predetermined amount, and a temperature raising and holding step of effecting feed-back control to raise the temperature in the second heating chamber to the predetermined second value and maintain the second value, and wherein the second stand-by step comprises a cooling step of lowering the temperature in the first heating chamber to a value lower than the predetermined third value by a predetermined amount, and a temperature raising and holding step of effecting feed-back control to raise the temperature in the first heating chamber to the predetermined third value and maintain the third value. In this arrangement, the temperature in the second heating chamber is first lowered below the second value and then raised to the second value while the first soaking step is implemented in the first heating chamber. Similarly, the temperature in the first heating chamber is first lowered below the third value and then raised to the third value while the second soaking step is implemented in the second heating chamber. This arrangement permits the second and third temperature values to be rapidly established in the first and second stand-by steps.

The second object indicated above may be achieved according to a second aspect of this invention, which provides a firing apparatus for uniformly heat-treating a substrate having a film-forming composition thereon, comprising: (a) shutter devices which partially define a first and a second heating chamber such that said first and second heating chambers are thermally insulated from each other; (b) a heating device for controlling temperatures in said first and second heating chambers, independently of each other; (c) a feeding device for feeding said substrate into said first and second heating chambers alternately, so that said substrate is heat-treated in said first and second chambers alternately; and (d) a control device for controlling said heating device to maintain the temperature in said first heating chamber at a predetermined first value while said substrate is heat-treated in said first heating chamber, and adjusting the temperature in said second heating chamber to a predetermined second value different from said predetermined first value by a predetermined difference while said substrate is heat-treated in said first heating chamber, said control device adjusting the temperature in said first heating chamber to a predetermined third value different from said predetermined second value by a predetermined difference while said substrate is heat-treated in said second heating chamber, so that said substrate is then heat-treated in said first heating chamber at said third value.

In the present firing apparatus, the substrate having a film-forming composition is heat-treated in the first heating chamber at the predetermined first temperature value for the predetermined first time for even distribution of the temperature throughout the entire mass of the substrate. Then, the substrate is fed by the feeding device into the second heating chamber the temperature of which is maintained at the predetermined second value different from the first value, and is heat-treated in the second heating chamber at the second value for the predetermined second time for even distribution of the temperature throughout the entire mass of the substrate. The temperature in the first heating chamber is adjusted to the predetermined third value different from the second value while the substrate is heat-treated in the second heating chamber, and the substrate is then heat-treated in the first heating chamber at the third value. Thus, the substrate is alternately placed in the first and second heating chambers, and heat-treated there at different temperatures, so that a local variation in the temperature within the substrate and the film-forming composition is minimized. Where the substrate is formed of a glass material and is heat-treated at temperatures higher than the strain point of the glass material, a local dimensional variation or configurational deviation of the substrate can be minimized. Accordingly, the present firing apparatus permits accurate positioning accuracy of films, layers or any other structural features subsequently formed on the substrate, resulting in a considerably increased yield ratio of the product which includes the substrate, even where the substrate has minute or intricate structural patterns or has a relatively large size. The film-forming composition provided on the surface of the substrate may be thick-film dielectric films, dielectric partition walls, thick-film resistor films, electrode films or inorganic pigment films. Since the present firing apparatus makes it possible to minimize the local temperature variation within the substrate and within such films or layers formed thereon, a glass material contained in the films or layers as a bonding component may be uniformly melted or softened in the heat treatment process, and a metallic material or metal oxide contained in the films may be uniformly melted or sintered. Accordingly, the product has reduced variation in its properties such as withstand voltage, resistance value, discharge characteristics and optical filter characteristics and in its dimensions such as height and width dimensions of the partition walls. Consequently, the yield ratio of the product is significantly improved, even where the substrate has a large size. Further, the reduced variation in the resistance value results in a reduced cost of control of the production steps and elimination of some steps such as trimming step.

Further, the present firing apparatus uses only the two heating chambers for heat treatment of the substrate, namely, only the first and second heating chambers to which the substrate is alternately fed for heat treatment. Accordingly, the longitudinal dimension of the firing apparatus is advantageously reduced.

In the present firing apparatus, the first, second and third temperature values are preferably determined to be close to the transition or strain point of a glass material or the melting or sintering point of a metallic or inorganic material so that the temperature of the substrate changes through the transition, strain, melting or sintering point indicated above, while the temperature of the substrate is evenly distributed throughout the substrate, as described above with respect to the firing process.

In one preferred form of the firing apparatus according to the second aspect of this invention, the apparatus further comprises a cooling device for lowering the temperatures in said first and second heating chambers. In this case, the temperature in the stand-by heating chamber in which the substrate is not currently heat-treated may be adjusted to the predetermined value, by first operating the cooling device to positively lower the temperature in the stand-by heating chamber to a level lower than the predetermined value and then controlling the heating device to adjust the temperature in the stand-by heating chamber to the predetermined value. The initial operation of the cooling device and the subsequent operation of the heating device permit rapid and uniform adjustment of the temperature in the stand-by heating chamber to the predetermined value at which the substrate is then heat-treated.

Preferably, the cooling device comprises cooling tubes for delivering cooling air into the first and second heating chambers, so that the temperature in the stand-by heating chamber is lowered by the cooling air delivered by the cooling tubes.

In another preferred form of the above firing apparatus, each of the shutter devices includes a shutter member movable between an open position and a closed position for thermal insulation of the first and second heating chambers. The shutter member is placed in the open position when the substrate is fed by the feeding device into or from the first or second heating chamber, and in the closed position while the substrate is heat-treated in one of the first and second heating chambers and while the temperature in the other heating chamber is adjusted. Since the shutter members of the shutter devices assure thermal insulation of the first and second heating chambers, the temperature can be evenly or uniformly distributed within the heating chambers during heat treatment of the substrate or during adjustment of the temperature in the stand-by heating chamber. Accordingly, the present arrangement permits a further reduced local variation in the temperature within the substrate.

The second object indicated above may also be achieved according to a third aspect of this invention, which provides a firing apparatus for uniformly heat-treating a substrate having a film-forming composition thereon, comprising: (a) shutter devices which partially define at least two heating chambers including a first and a second heating chamber such that said at least two heating chambers are thermally insulated from each other; (b) a heating device for controlling temperatures in said first and second heating chambers independently of each other; (c) a temperature control device for controlling said heating device to maintain the temperature in said first heating chamber at a predetermined first value uniformly throughout said first heating chamber, and to maintain the temperature in said second heating chamber at a predetermined second value uniformly throughout said second heating chamber, said second value being different from said first value by a predetermined difference; and (d) a feeding device for feeding said substrate in one feeding direction, first into said first heating chamber for heat-treating said substrate at said predetermined first value for a predetermined first time, and then into said second heating chamber for heat-treating said substrate at said predetermined second value for a predetermined second time, said feeding device further feeding said substrate from said second heating chamber after heat treatment thereof in said second heating chamber.

In the present firing apparatus according to the third aspect of the invention, the substrate having a film-forming composition is heat-treated in the first heating chamber at the predetermined first temperature value for the predetermined first time for even distribution of the temperature throughout the entire mass of the substrate. Then, the substrate is fed by the feeding device into the second heating chamber the temperature of which is maintained at the predetermined second value different from the first value, and is heat-treated in the second heating chamber at the second value for the predetermined second time for even distribution of the temperature throughout the entire mass of the substrate. Thus, the substrate is heat-treated in the first and second heating chambers at different temperatures so that a local variation in the temperature within the substrate and the film-forming composition is minimized. Where the substrate is formed of a glass material and is heat-treated at temperatures higher than the strain point of the glass material, a local dimensional variation or configurational deviation of the substrate can be minimized. Accordingly, the present firing apparatus permits accurate positioning accuracy of films, layers or any other structural features subsequently formed on the substrate, resulting in a considerably increased yield ratio of the product which includes the substrate, even where the substrate has minute or intricate structural patterns or has a relatively large size. The film-forming composition provided on the surface of the substrate may be thick-film dielectric films, dielectric partition walls, thick-film resistor films, electrode films or inorganic pigment films. Since the present firing apparatus makes it possible to minimize the local temperature variation within the substrate and within such films or layers formed thereon, a glass material contained in the films or layers as a bonding component may be uniformly melted or softened in the heat treatment process, and a metallic material or metal oxide contained in the films may be uniformly melted or sintered. Accordingly, the product has reduced variation in its properties such as withstand voltage, resistance value, discharge characteristics and optical filter characteristics and in its dimensions such as height and width dimensions of the partition walls. Consequently, the yield ratio of the product is significantly improved, even where the substrate has a large size. Further, the reduced variation in the resistance value results in a reduced cost of control of the production steps and elimination of some steps such as trimming step.

Further, the substrate is heat-treated at the different first and second temperature values in the first and second heating chambers while it is fed in one direction by the feeding device. Accordingly, the overall length of the present firing apparatus can be made smaller than that of a conventional continuous feeding type firing apparatus which is adapted to continuously feed the substrate so as to cool the temperature of the substrate according to a continuous temperature cooling pattern that permits the substrate to have an extremely reduced local temperature variation. Since the present apparatus does not have a stand-by heating chamber as provided in a shutter type apparatus in which the substrate is reciprocated between two heating chambers, the present apparatus provides an accordingly increased degree of heat treating efficiency and is suitable for mass production of a product using the substrate.

In one preferred form of the present apparatus according to the third aspect of the invention, each of the shutter devices includes a shutter member movable between an open position and a closed position for thermal insulation of the first and second heating chambers. The movable shutter member is placed in the open position when the substrate is fed by the feeding device into or from the first or second heating chamber, and in the closed position while the substrate is heat-treated in the first or second heating chamber. Since the shutter members of the shutter devices assure thermal insulation of the first and second heating chambers, the temperature can be evenly or uniformly distributed within the heating chambers during heat treatment of the substrate. Accordingly, the present arrangement permits a further reduced local variation in the temperature within the substrate.

In another preferred form of the present apparatus, the feeding device comprises a plurality of rollers whose axes of rotation are parallel to each other and perpendicular to the above-indicated one feeding direction and which are arranged in this feeding direction to support the substrate. The rollers are rotated to feed the substrate in the feeding direction. In this arrangement, the substrate is supported by the plurality of rollers and fed in the predetermined feeding direction with the rollers being rotated. Thus, the rollers are used in place of a generally used endless belt made of a mesh of refractory metal, for example. In the present arrangement, the two or more heating chambers including the first and second heating chambers and the feeding device provide a roller hearth kiln for firing the substrate having films formed thereon. In this roller hearth kiln, the films formed on the substrate are less likely to be adversely influenced by dust which may be considerably scattered in a heating area using a conveyor belt. Namely, the feeding of the substrate by the rotating rollers is less likely to deteriorate the function of the films on the substrate due to dust during the heat treatment therein.

In one advantageous arrangement of the above preferred form of the apparatus, one of the shutter devices includes a shutter which is movable in a vertical direction perpendicular to the feeding direction, between an open position and a closed position, through a gap between adjacent ones of the plurality of rollers. The shutter placed in the closed position separates the first and second heating chambers from each other with thermal insulation therebetween. In this arrangement, the shutter is vertically movable without an interference with the rollers, permitting complete thermal insulation of the first and second heating chambers, and assuring improved uniformity of temperature in each heating chamber and accordingly reduced local variation of the temperature within the substrate.

In another advantageous arrangement of the above preferred form of the apparatus, each of the plurality of rollers is made of a ceramic material. In this case, the rollers are less likely to be worn, rusted, damaged or deteriorated due to contact with the substrate and heating in the heating chambers, assuring an reduced amount of dust produced in the heating chambers and accordingly enhanced quality of the fired substrate.

Where the rollers are made of a ceramic material, each of the above-indicated two heating chambers has an inner wall surface preferably made of a ceramic material, and the shutter of each shutter device is also preferably made of a ceramic material. Thus, the rollers of the feeding device, the shutters and the inner wall surfaces of the heating chambers are all made of the ceramic material, and are less likely to be worn, rusted, damaged or deteriorated due to heating, assuring a further reduced amount of dust produced in the heating chambers.

In a further preferred form of the firing apparatus according to the third aspect of the invention, the feeding device includes an intermittently feeding device for intermittently feeding the substrate by rotation of the plurality of rollers through the at least two heating chambers, and a continuously feeding device for continuously feeding the substrate by rotation of the rollers at a predetermined feeding speed through a continuous heat treatment zone which includes an area adjacent to the at least two heating chambers. The continuously feeding device includes a feeding speed changing device for changing rotating speeds of the rollers in the above-indicated area so that a feeding speed of the substrate in this area is almost equal to the feeding speed by the intermittently feeding device.

In the above preferred form of the firing apparatus, the substrate is fed intermittently through the at least two heating chambers, and is continuously fed at a given speed through the continuous heat treatment zone. In the above-indicated area of the continuous heat treatment area adjacent to the first heating chamber, for example, the rotating speed of the rollers and the feeding speed of the substrate are raised to those of the intermittently feeding device, so that the substrate may be smoothly and relatively rapidly fed from the above area into the first heating chamber, so that the time required for the substrate to move between the above area and the first heating chamber is shortened, making it possible to reduce the local variation of the temperature within the substrate due to a difference in the temperatures between the above area of the continuous heat treatment zone and the first heating chamber, for example. Further, the feeding speed changing device is effective to reduce an amount of sliding movement between the rollers and the substrate due to the difference in the feeding speed between the above area and the first heating chamber, whereby the amount of dust produced in the furnace is accordingly reduced. It is also noted that the shutters of the shutter devices are placed in their open position for a time as short as possible, so as to minimize a deviation of the temperature in each heating chamber from the predetermined values and an uneven temperature distribution within each heating chamber.

BRIEF DESCRIPTION OF THE DRAWINGS

The above and optional objects, features, advantages and technical and industrial significance of this invention will be better understood by reading the following detailed description of presently preferred embodiments of the invention, when considered in connection with the accompanying drawings, in which.

DETAILED DESCRIPTION OF THE PREFERRED EMBODIMENTS

Figure 1:
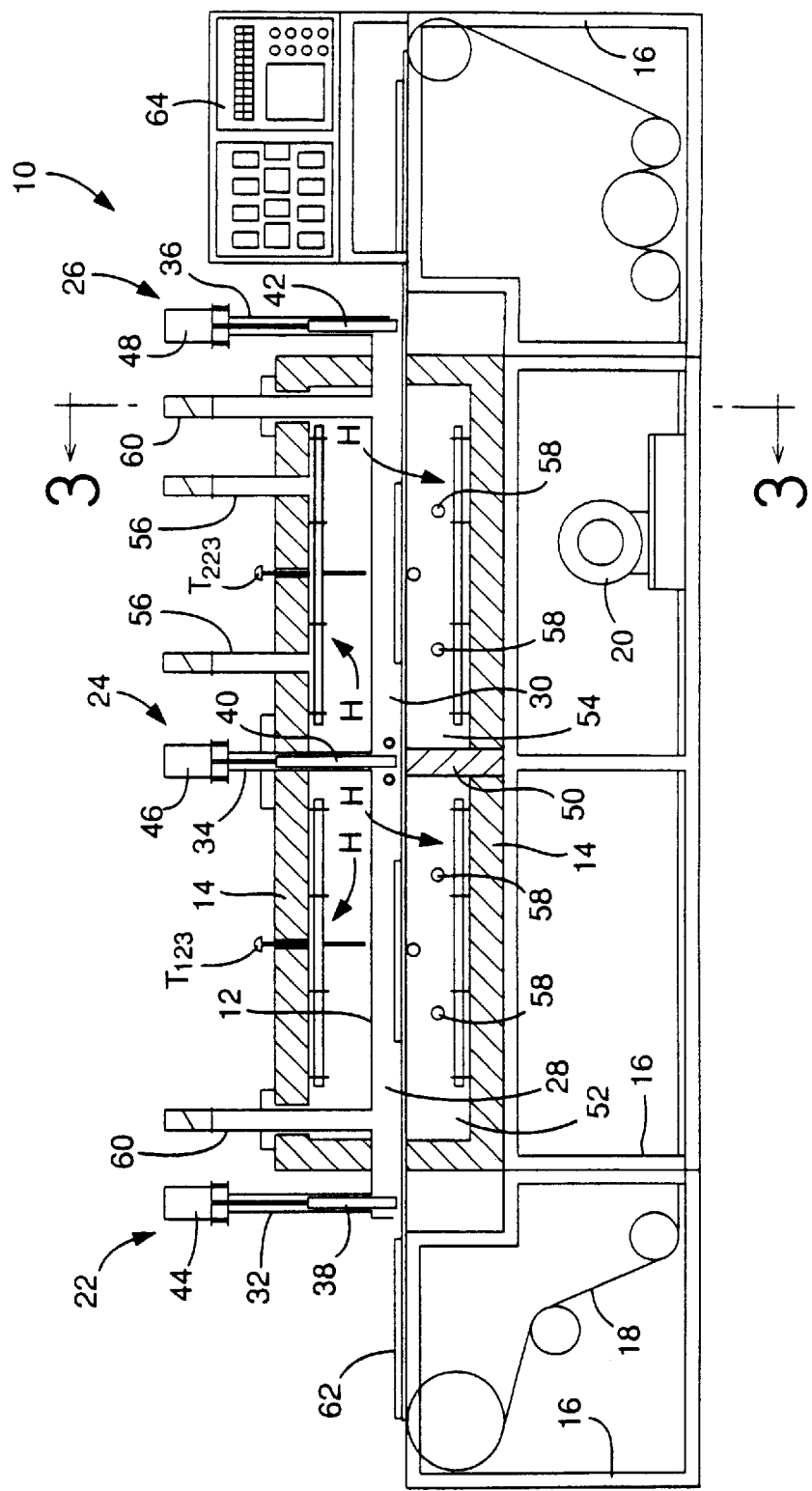
FIG. 1 is a front elevational view of a two-chamber type firing apparatus constructed according to one embodiment of this invention, with a furnace being shown in cross section.
Figure 2:
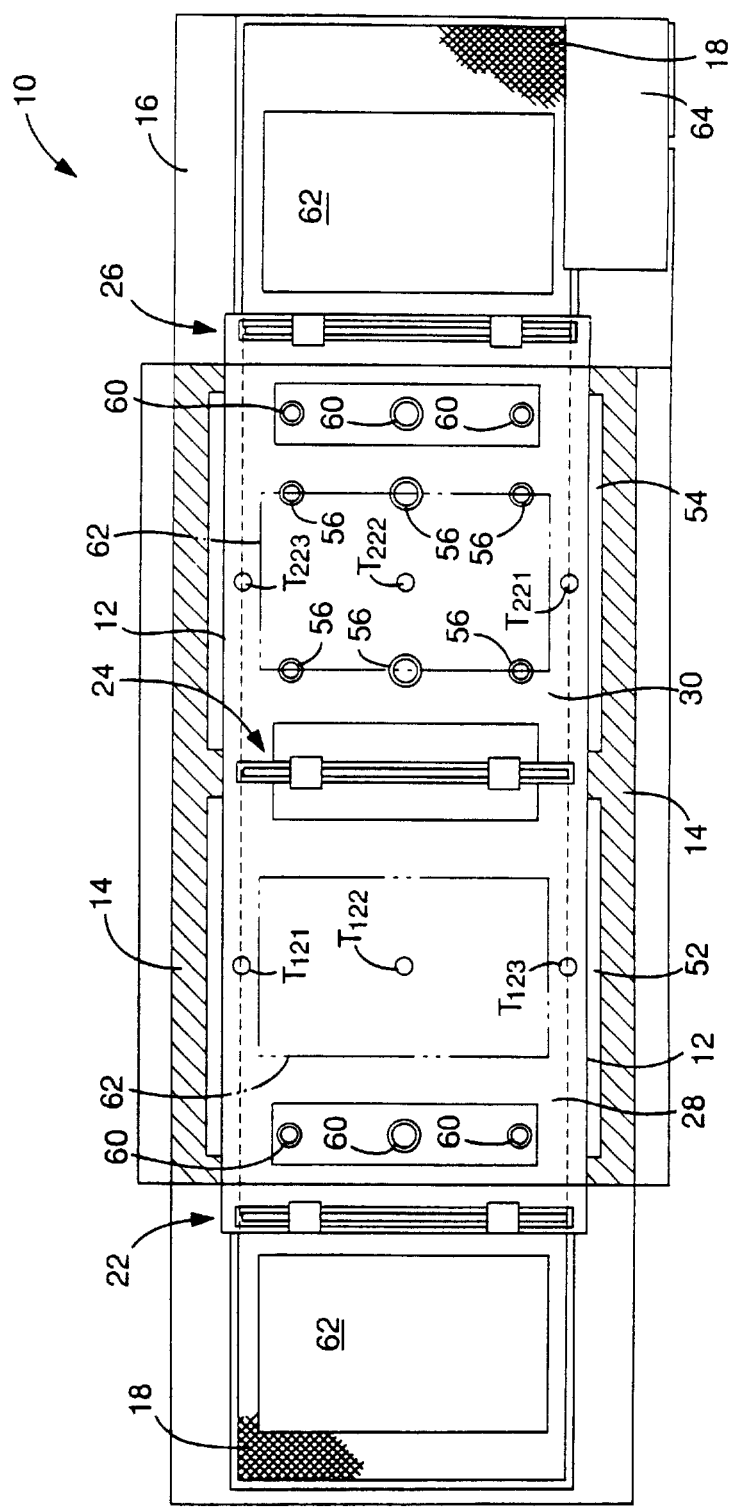
FIG. 2 is a plan view of the firing apparatus of FIG. 1, with an adiabatic wall being shown in cross section.
Figure 3:
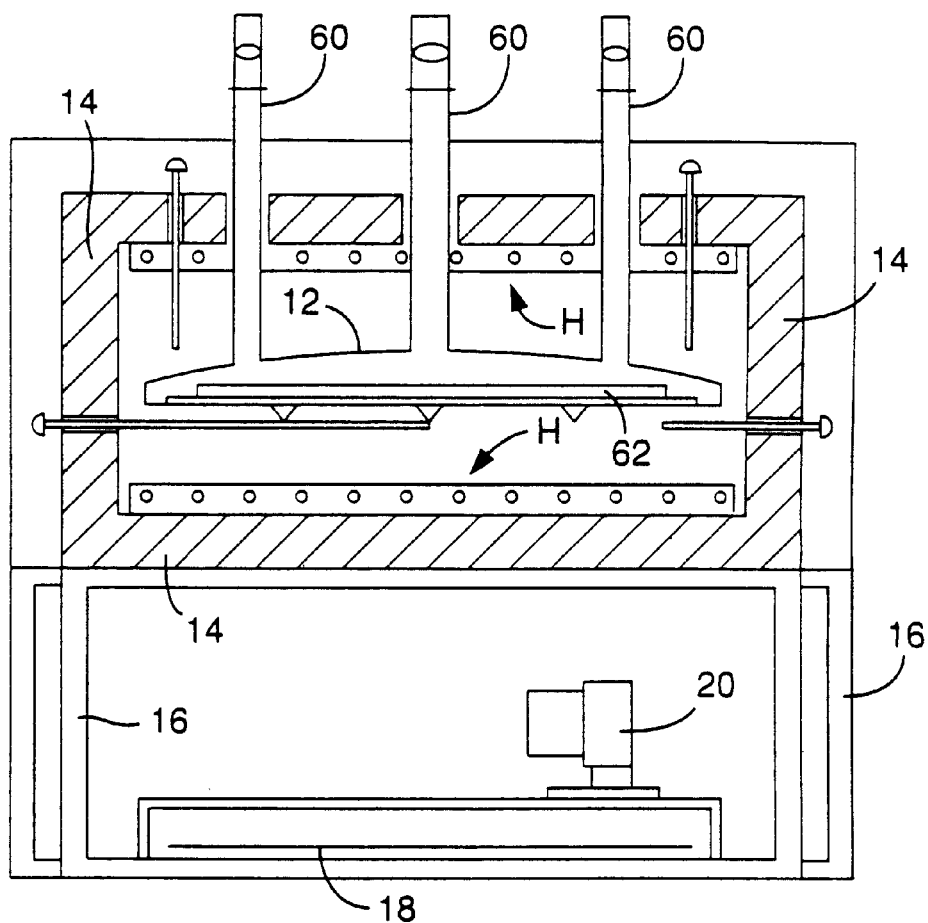
FIG. 3 is an end elevational view of the firing apparatus of FIG. 1, taken along line 3—3 of FIG. 1.

Referring first to the front elevational view of FIG. 1, plan view of FIG. 2 and side elevational view of FIG. 3, there is shown a shuttle type or two-chamber type firing apparatus 10 constructed according to one embodiment of this invention.

The firing apparatus 10 includes a generally planar tunnel type muffle furnace 12 made of stainless steel SUS310 or Inconel (Ni-Cr-Fe alloy). The muffle furnace 12 is accommodated in an adiabatic wall structure 14, except at its longitudinal opposite end portions. The adiabatic wall structure 14 is supported by a frame 16, and the muffle furnace 12 is supported in a horizontal posture by the adiabatic wall structure 14. An endless belt 18 formed from a stainless or Inconel mesh is run within the frame 16 such that an upper space of the endless belt 18 extends through the tunnel type muffle furnace 12. This endless belt 18 is driven by a belt drive device 20 disposed in the frame 16.

The muffle furnace 12 is provided with an inlet shutter device 22, an intermediate shutter device 24 and an outlet shutter device 26 at its inlet end portion, intermediate portion and outlet end portion, respectively. With these shutter devices 22, 24, 26 placed in their closed positions, the interior of the muffle furnace 12 is divided into a first heating chamber 28 and a second heating chamber 30 which are thermally insulated from each other, so that the temperatures within these two heating chambers 28, 30 can be controlled independently of each other. The shutter devices 22, 24, 26 include respective shutter members 38, 40, 42 which are vertically movable along respective shutter paths 32, 34, 36 between the lower closed position and the upper open position. The shutter devices 22, 24, 26 further include respective shutter drive motors 44, 46, 48 for vertically moving the shutter members 38, 40, 42, respectively.

Figure 4:
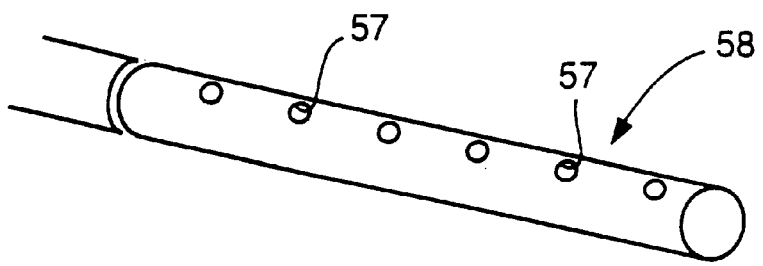
FIG. 4 is a perspective view of a cooling tube used in the embodiment of FIG. 1.

Between the muffle furnace 12 and the adiabatic wall structure 14, there is formed a space which is divided by a partition wall 50 and the shutter path 34 into a first vacuum chamber 52 and a second vacuum chamber 54, which surround the first and second heating chambers 28, 30 of the muffle furnace 12, respectively. A plurality of air discharger passages 56 are formed through the upper wall of the adiabatic wall structure 14, for evacuating the first and second vacuum chambers 52, 54. The air discharger passages 56 for the first vacuum chamber 52 are not shown in FIGS. 1 and 2. Each air discharger passage 56 is provided with a suitable damper. A plurality of cooling tubes 58 each having a plurality of nozzles 57 as shown in FIG. 4 are provided in each of the first and second vacuum chambers 52, 54, for delivering cooling air against the muffle furnace 12 to positively lower the temperatures in the first and second heating chambers 28, 30. As described below, the first and second heating chambers 28, 30 are alternately used to process a substrate 62 such that the substrate 62 is heat-treated at a given temperature in one of these two heating chambers 28, 30 while the temperature in the other heating chamber (hereinafter referred to as "stand-by heating chamber") is controlled to a level different from the temperature in the above-indicated one heating chamber (hereinafter referred to as "operating heating chamber"), so that the substrate 62 is then introduced into the stand-by heating chamber for the heat treatment thereof. Before the temperature in the stand-by heating chamber 28, 30 is controlled to the predetermined level, the cooling air is delivered by the cooling tubes 58 against the portion of the muffle furnace 12 corresponding to the stand-by heating chamber, for temporarily positively lower the temperature in the stand-by heating chamber. This pre-cooling of the stand-by heating chamber permits its temperature to be subsequently controlled rapidly and uniformly to the predetermined level.

At each of the inlet and outlet end portions of the muffle furnace 12, there are provided three exhaust passages 60 each equipped with a damper, for discharging exhaust gases from the first and second heating chambers 28, 30.

Figure 5:
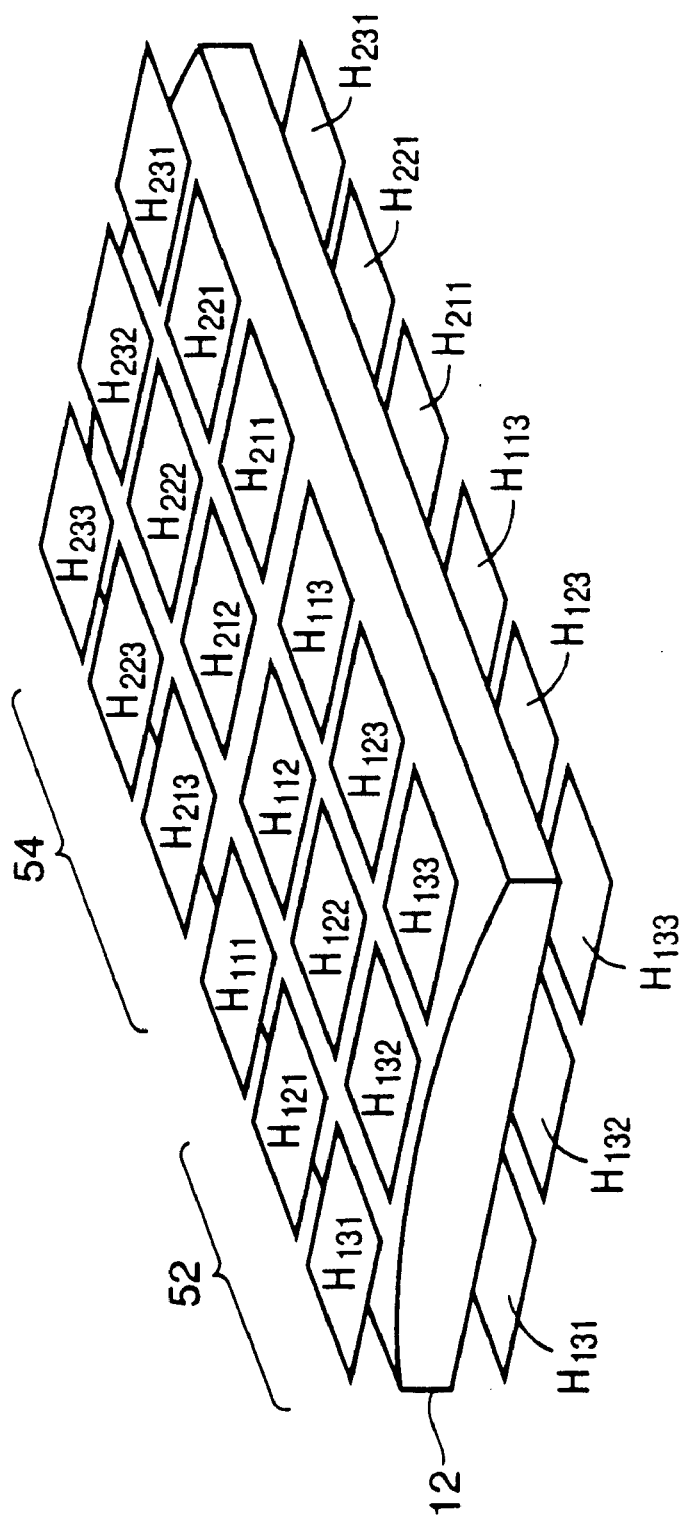
FIG. 5 is a view showing an arrangement of a plurality of heaters in the embodiment of FIG. 1.

On the inner surfaces of the upper and lower walls of the adiabatic wall structure 14 which partly define the first and second vacuum chambers 52, 54, there are disposed a multiplicity of heaters H arranged in a matrix pattern. These heaters H consist of two or more groups of heaters so that the heaters in one group are controlled independently of the heaters in another group. For instance, the heaters H in the first vacuum chamber 52 consist of nine pairs of heaters $H_{111}$, $H_{112}$, $H_{113}$, $H_{121}$, $H_{122}$, $H_{123}$, $H_{131}$, $H_{132}$, $H_{133}$ arranged in a matrix of three columns extending in the feeding direction of the substrate 62 by the endless belt 18 and three rows extending in the width direction of the endless belt 18, as shown in FIG. 5. Each pair of heaters consists of an upper heater and a lower heater provided on the upper and lower walls of the adiabatic wall structure 14. Similarly, the heaters H in the second vacuum chamber 54 consist of nine pairs of heaters $H_{211}$, $H_{212}$, $H_{213}$, $H_{221}$, $H_{222}$, $H_{223}$, $H_{231}$, $H^2_{32}$, $H_{233}$ arranged in a matrix of three columns and three rows.

Figure 6:
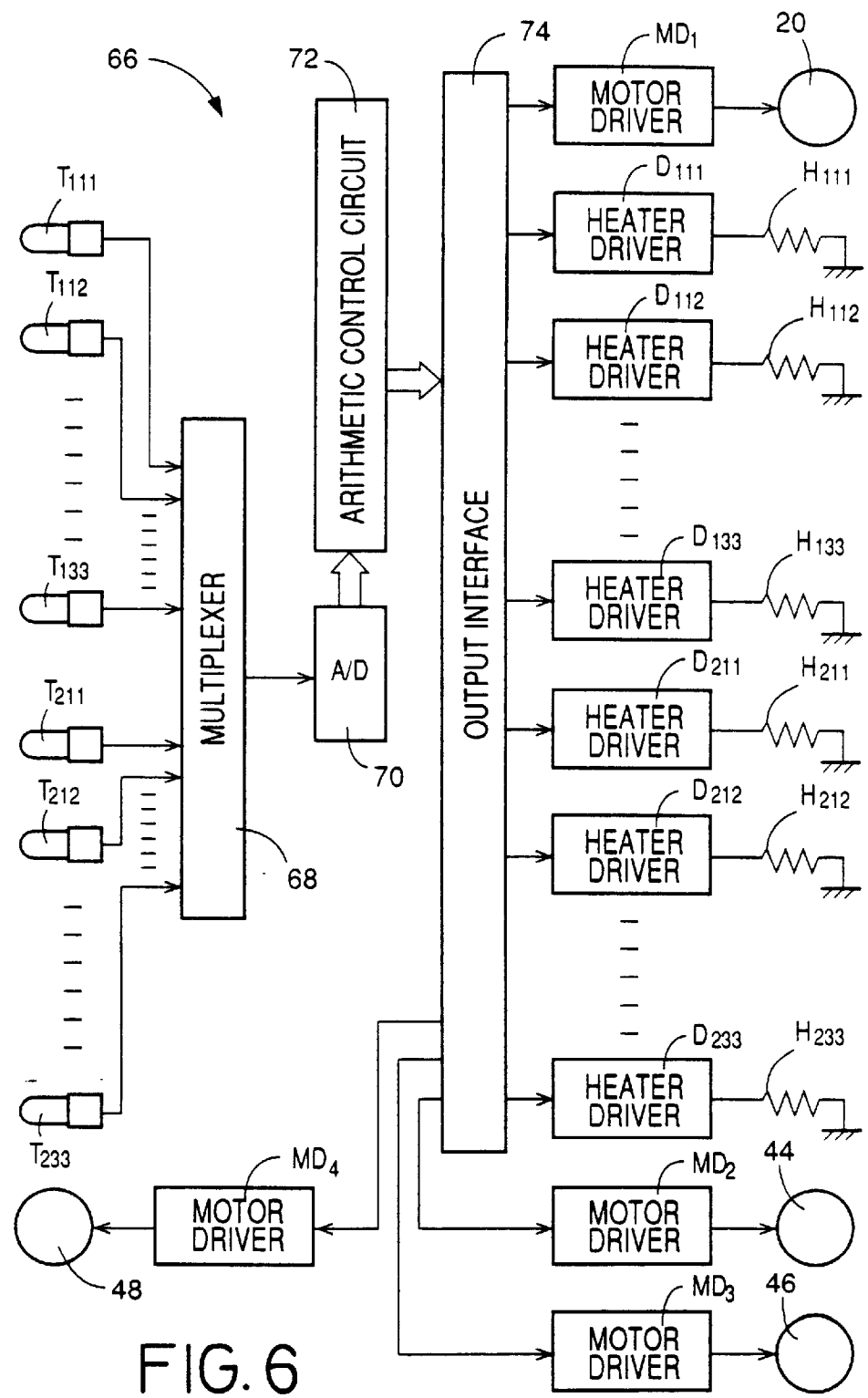
FIG. 6 is a block diagram illustrating a control system of the firing apparatus of FIG. 1.

A multiplicity of temperature detectors T are provided at respective positions corresponding to those of the heaters H, for detecting the temperature at the corresponding positions in the first and second heating chambers 28, 30. That is, the heaters T consist of nine temperature detectors $T_{111}$, $T_{112}$, $T_{113}$, $T_{121}$, $T_{122}$, $T_{123}$, $T_{131}$, $T_{132}$, $T_{133}$ for detecting the heating temperatures of the nine pairs of heaters $H_{111}$, $H_{112}$, $H_{113}$, $H_{121}$, $H_{122}$, $H_{123}$, $H_{131}$, $H_{132}$, $H_{133}$ in the first heating chamber 28, and nine temperature detectors $T_{211}$, $T_{212}$, $T_{213}$, $T_{221}$, $T_{222}$, $T_{223}$, $T_{231}$, $T_{232}$, $T_{233}$ for detecting the heating temperatures of the nine pairs of heaters $H_{211}$, $H_{212}$, $H_{213}$, $H_{221}$, $H_{222}$, $H_{223}$, $H_{231}$, $H_{232}$, $H_{233}$ in the second heating chamber 30, as indicated in FIG. 6. In FIGS. 1–3, only some of these heaters T are shown.

The firing apparatus 10 further includes a control console 64 as shown in FIG. 1, which incorporates a control device 66 as shown in FIG. 6. The control device 66 includes a multiplexer 68 for combining in a time-sharing manner the output signals of the temperature detectors $T_{111}$, $T_{112}$, $T_{113}$, $T_{121}$, $T_{122}$, $T_{123}$, $T_{131}$, $T_{132}$, $T_{133}$ for detecting the temperatures in the first heating chamber 28 and the temperature detectors $T_{211}$, $T_{212}$, $T_{213}$, $T_{221}$, $T_{222}$, $T_{223}$, $T_{231}$, $T_{232}$, $T_{233}$ for detecting the temperatures in the second heating chamber 30. The output signals of these temperature detectors T are fed from the multiplexer 68 to an A/D convertor 70, and digital output signals of the A/D convertor 70 are fed to an arithmetic control circuit 72. For example, this arithmetic control circuit 72 is constituted by a microcomputer which is adapted to process the output of the A/D convertor 70 according to control programs stored in a read-only memory while utilizing a temporary data storage function of a random-access memory. The arithmetic control circuit 72 generates control signals to be applied through an output interface 74 to a motor driver $MD_1$, heater drivers $D_{111}$, $D_{112}$, $D_{113}$, $D_{121}$, $D_{122}$, $D_{123}$, $D_{131}$, $D_{132}$, $D_{133}$, $D_{211}$, $D_{212}$, $D_{213}$, $D_{221}$, $D_{222}$, $D_{223}$, $D_{231}$, $D_{232}$, $D_{233}$ and motor drivers $MD_2$, $MD_3$ and $MD_4$. The motor driver $MD_1$ is provided for activating the belt drive device 20, and the heater drivers MD are provided for activating the heaters $H_{211}$, $H_{212}$, $H_{213}$, $H_{221}$, $H_{222}$, $H_{223}$, $H_{231}$, $H_{232}$, $H_{233}$. The motor drivers $MD_2$, $MD_3$ and $MD_4$ are provided for activating the shutter drive motors 44, 46, 48, respectively.

The above-indicated heaters $H_{211}$, $H_{212}$, $H_{213}$, $H_{221}$, $H_{222}$, $H_{223}$, $H_{231}$, $H_{232}$, $H_{233}$ are controlled according to target temperature values at the corresponding positions or according to relative output ratios of those heaters, so that the temperature within each of the first and second heating chambers 28, 30 is held even throughout the space in the heating chamber. For instance, the outputs of the heaters $H_{111}$, $H_{113}$, $H_{121}$, $H_{123}$, $H_{131}$, $H_{133}$, $H_{211}$, $H_{213}$, $H_{221}$, $H_{223}$, $H_{231}$, $H_{233}$ in the outer columns located at the widthwise ends of the muffle furnace 12 are made higher than those of the heaters $H_{112}$, $H_{122}$, $H_{132}$, $H_{212}$, $H_{222}$, $H_{232}$ in the intermediate column located at the widthwise central position of the muffle furnace 12. Similarly, the outputs of the heaters $H_{131}$, $H_{132}$, $H_{133}$, $H_{231}$, $H_{232}$, $H_{233}$ in the outermost rows located at the longitudinally ends of the muffle furnace 12 are made higher than those of the heaters $H_{121}$, $H_{122}$, $H_{123}$, $H_{221}$, $H_{222}$, $H_{223}$ in the inner rows located at the longitudinally inner positions of the muffle furnace 12. In this respect, it is noted that the heaters in the outer columns and in the outermost rows are more likely to be cooled than the other heaters. Thus, the outputs of the heaters $H_{131}$, $H_{133}$, $H_{231}$, $H_{233}$ are controlled to be the highest, and the outputs of the heaters $H_{132}$, $H_{121}$, $H_{123}$, $H_{232}$, $H_{221}$, $H_{223}$ are controlled to be the second highest.

Figure 7:
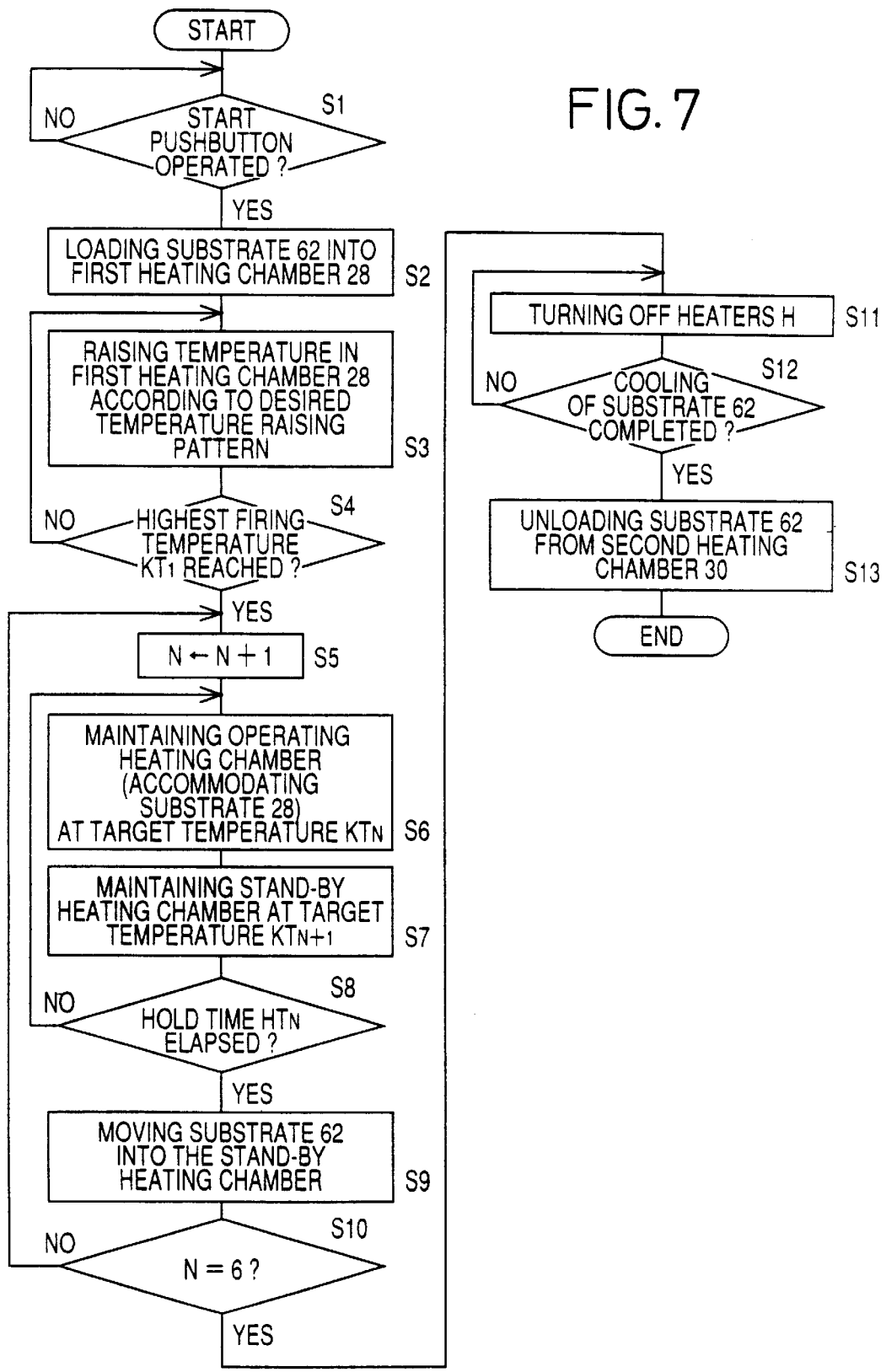
FIG. 7 is a flow chart illustrating an operation of an arithmetic control circuit in the control system of FIG. 6.

Referring next to the flow chart of FIG. 7, there will be described an operation of the arithmetic control circuit 72 to control the firing apparatus 10. A routine illustrated in FIG. 7 is initiated with step S1 to determine whether a START signal for starting the operation of the firing apparatus 10 is present as a result of operation of a START pushbutton provided on the control console 64. If an affirmative decision (YES) is obtained in step S1, the control flow goes to step S2 in which the inlet shutter device 22 is operated to move the shutter member 38 to the upper open position, and the endless belt 18 is operated so that the substrate 62 in a green or unfired state placed on the endless belt 18 is loaded or introduced into the first heating chamber 28. Then, the inlet shutter device 22 is operated to move the shutter member 38 to the lower closed position. This point of time is indicated at t1 in FIG. 8.

Figure 8:
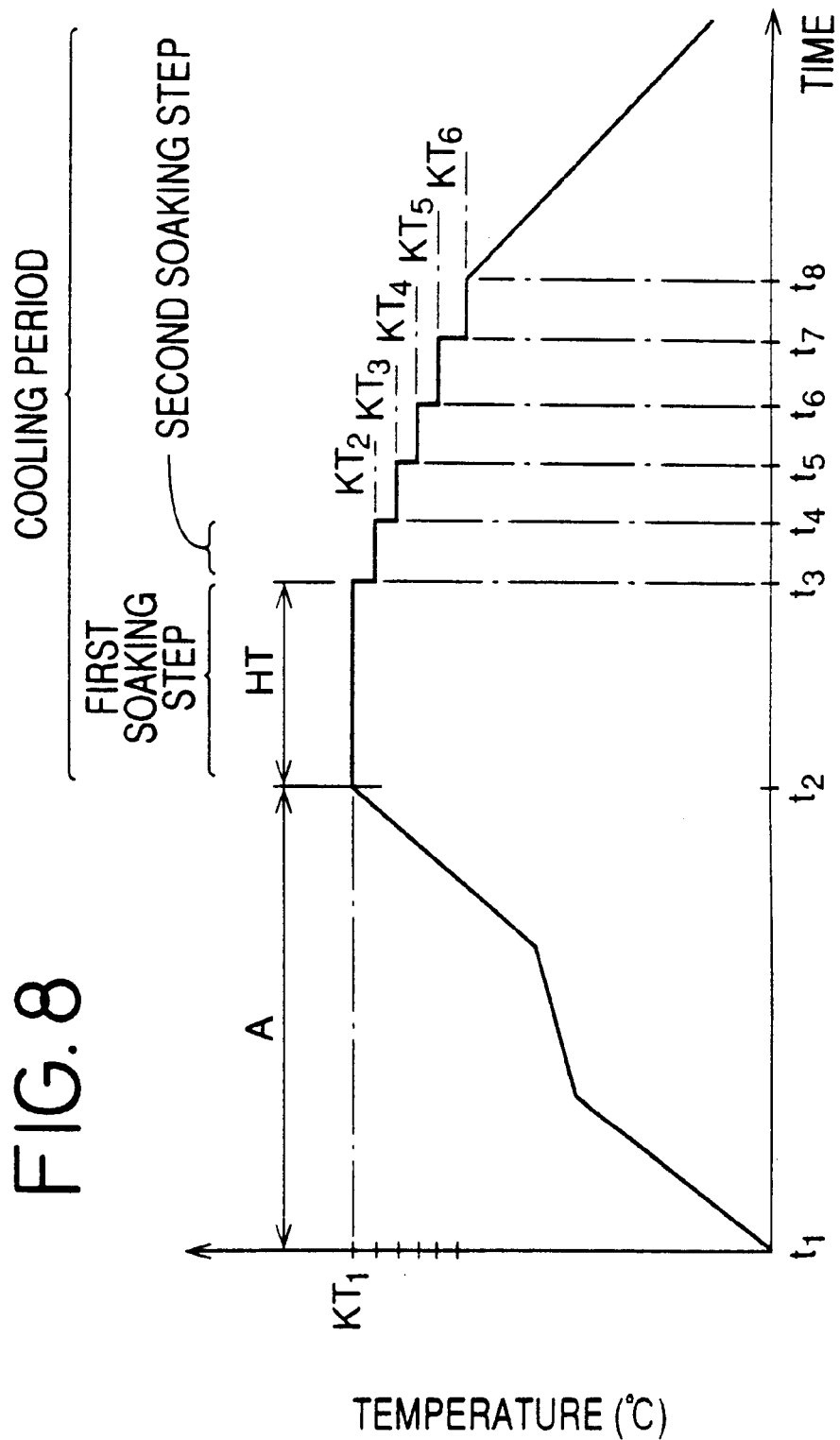
FIG. 8 is a time chart indicating a change in the temperature of a substrate controlled by the operation illustrated in the flow chart of FIG. 7.

Step S2 is followed by step S3 in which the heaters T are activated and feed-back controlled to raise the temperature in the first heating chamber 28, according to a desired temperature raising pattern, during a time period A between the points of time t1 and t2 indicated in FIG. 8, wherein an example of the temperature raising pattern is indicated corresponding to the time period A. The time period A is a temperature raising period. Then, the control flow goes to step S4 to determine whether the temperature in the first heating chamber 28 has reached the highest firing temperature $KT_1$ (e.g., about 500° C.) of the temperature raising pattern. If a negative decision (NO) is obtained in step S4, steps S3 and S4 are repeatedly implemented until an affirmative decision (YES) is obtained in step S4, that is, until the highest temperature $KT_1$ is reached. If the affirmative decision (YES) is obtained in step S4, the control flow goes to step S5 and the following steps to initiate a cooling operation. That is, a cooling period begins at the point of time t2 indicated in FIG. 8.

Figure 9:
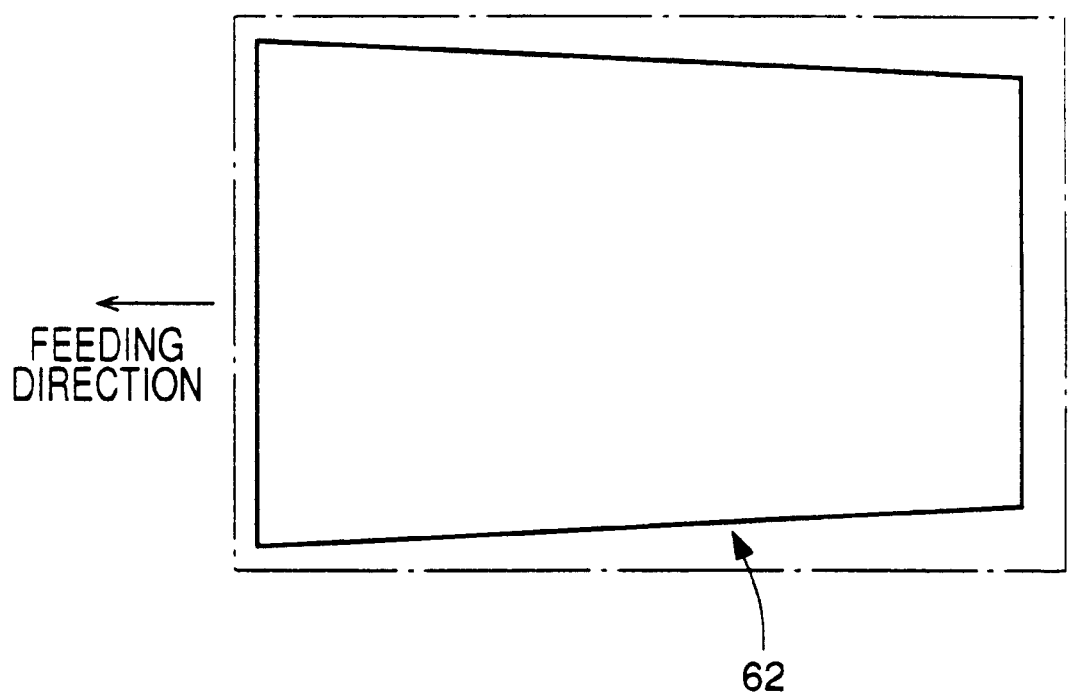
FIG. 9 is a view for explaining local deformation of the substrate in a conventional firing apparatus.

It is noted that the condition in which the cooling step is performed after the highest temperature $KT_1$ (e.g., about 500° C. or higher) of the temperature raising pattern is reached is important in the heat treatment of the substrate 62. For instance, the substrate 62 is used for a vacuum fluorescent display (VFD), a plasma display panel (PDP), a plasma address liquid crystal display (PALC) or a field-emission display (FED). The substrate 62 for such devices may be of a glass such as soda-lime glass having a relatively low strain point. In this case, the temperature within the substrate 62 is likely to be uneven and have different cooling rates at different local portions thereof, leading to a local dimensional variation or deviation thereof, which makes it difficult to achieve accurate alignment or relative positioning of multiple thick films formed by printing thereon. The local dimensional variation or deviation may also make it impossible to accurately align printed thick films of front and rear plates which form multiple cells in a plasma display panel (PDP) or field-emission display (FED). The yield ratio of the display device, which is lowered due to such local dimensional variation or deviation, is lowered with an increase in the screen size of the display device, which means an increase in the temperature variation of the substrate 62. When the screen size is as large as 40 inches, for instance, the yield ratio of the display device is considerably low. FIG. 9 shows an example of the local dimension variation of the substrate 62 caused by different cooling rates at different positions according to a conventional firing process. Described more specifically, the substrate 62 heated and cooled in the conventional process has a smaller width dimension at its trailing end than at its leading end as viewed in the feeding direction, as indicated by solid line, when the cooling rate is higher at the leading end than at the trailing end. In FIG. 9, one-dot chain line indicates the dimension prior to the firing of the substrate 62. Where the substrate 62 has a multiplicity of thick-film resistors or bonding pads formed thereon by printing, the resistance value of the resistors and the ease of bonding of the bonding pads are influenced by different cooling rates at different positions of the substrate, which are caused by uneven distribution of the temperature within the substrate, since the different cooling rates cause a variation in the fusion, melting or softening of a glass component included as a bonding agent in the functional thick films, or cause a variation in the melting or sintering of a powdered metal or inorganic material included in the thick films. The yield ratio of the product is lowered due to the variation in the resistance value of the resistors and the ease of bonding of the bonding pads, particularly, where the substrate is large. Where the substrate 62 has rib walls formed by lamination of dielectric films or layers by thick-film printing, the temperature within the substrate 62 tends to be uneven, leading to a local variation in the cooling rate, which may results in a variation in the melting or softening of a glass component contained in the dielectric films, and a consequent variation in the firing shrinkage of the substrate, namely, a variation in the thickness and width dimensions of the dielectric films. In this respect, too, the yield ratio of the product is lowered with an increase in the size of the substrate 62.

Referring back to the flow chart of FIG. 7, step S4 is followed by step S5 if the affirmative decision (YES) is obtained in step S4 as mentioned above. In step S5, a counter N which is initially reset to zero is incremented. The counter N is incremented to select a target temperature $KT_N$ and a holding time HT in the following steps, according to predetermined data maps. Then, the control flow goes to step S6 in which the heaters H in the first vacuum chamber 52 are feed-back controlled to maintain the temperature in the first heating chamber 28 (in which the substrate 62 is now accommodated) at a target temperature $KT_N$, namely, at a predetermined first target temperature $KT_1$ which is the highest temperature according to the temperature raising pattern, since the content of the counter N is now equal to "1". Consequently, the temperature within the substrate 62 is maintained at the first target value $KT_1$ with even temperature distribution throughout the substrate 62. Then, step S7 is implemented to feed-back control the heaters H in the second vacuum chamber 54 to maintain the temperature in the second heating chamber 28 (in which the substrate 62 is not accommodated) at a target temperature $KT_{N+1}$, namely, at a predetermined second target temperature $KT_2$, since N+1 is now equal to 2. The second target temperature $KT_2$ is lower than the first target temperature $KT_1$ (highest temperature) by a predetermined decrement value $\Delta KT$. This decrement value $\Delta KT$ may range from a few or several degrees of centigrade (°C.) to a few or several degrees higher than 10° C. In the following description, one of the first and second heating chambers 28, 30 in which the substrate 62 is now accommodated for heat treatment is referred to as "operating heating chamber" while the other heating chamber in which the substrate 62 is not accommodated is referred to as "stand-by heating chamber", where appropriate. When step S5 is implemented for the first time, the first heating chamber 28 is the operating heating chamber while the second heating chamber 30 is the stand-by chamber which will accommodate the substrate 62 after the heat treatment thereof in the operating heating chamber.

Step S7 is followed by step S8 to determine whether the time during which the temperature in the first heating chamber 29 is maintained at the first target temperature $KT_1$ has reached a predetermined holding time $HT_N$, namely, a predetermined first holding time $HT_1$ since the content of the counter N is now equal to "1". The first holding time $HT_1$ may range from some minutes longer than 10 minutes to a few or several tens of minutes. Initially, a negative decision (NO) is obtained in step S8, and steps S6-S8 are repeatedly implemented until an affirmative decision (YES) is obtained in step S8. A time period corresponding to the first holding time $HT_1$ corresponds to a first soaking step (temperature equalizing step) for holding the temperature in the first or operating heating chamber 28 at the first target temperature $KT_1$ to establish even distribution of the temperature throughout an entire mass of the substrate 62, and also corresponds to a stand-by step for adjust the temperature in the second or stand-by heating chamber 30 to the second target temperature $KT_2$, to thereby prepare the stand-by heating chamber 30 for a second soaking step (temperature equalizing step) for establishing even distribution of the temperature throughout the entire mass of the substrate 62.

If the affirmative decision (YES) is obtained in step S8 during repeated implementation of steps S6–S8, the control flow goes to step S9 (feeding step) in which the intermediate shutter device 24 is activated to move the shutter member 40 to its upper open position, and the endless belt 18 is operated to feed the substrate from the first heating chamber 28 into the second or stand-by chamber 30. The shutter member 40 is then moved to its lower closed position. This point of time is indicated at t3 in FIG. 8.

Then, the control flow goes to step S10 to determine whether the content of the counter N is equal to "6". When this step S10 is implemented for the first time, a negative decision (NO) is obtained, and the control flow goes to step S5 to increment the counter N to "2". Consequently, the heaters H in the second vacuum chamber 54 are feed-back controlled in step S6 so that the temperature in the second heating chamber 30 which is now the operating heating chamber is maintained at the second target temperature $KT_2$. As a result, the temperature within the substrate 62 is maintained at the second target value $KT_2$ with even temperature distribution throughout the entire mass of the substrate 62. In the following step S7, the heaters H in the first vacuum chamber 52 are feed-back controlled so that the temperature in the first or operating heating chamber 28 is maintained at a predetermined third target temperature $KT_3$ which is lower than the second target temperature $KT_2$ by the predetermined decrement value $\Delta KT$. Step S8 is then implemented to determine whether the time during which the temperature in the operating heating chamber 30 is maintained at the second target temperature $KT_2$ has reached a second holding time $HT_2$ (=$HT_N$ where N=2). Immediately after the counter N is incremented to "2", a negative decision (NO) is obtained in step S8, and steps S6–S8 are repeatedly implemented. The second holding time $HT_2$ corresponds to the second soaking step for holding the temperature in the second or operating heating chamber 28 at the second target temperature $KT_2$, and also corresponds to a stand-by step for holding the temperature in the first or stand-by heating chamber 28 at the third target temperature $KT_3$, to thereby prepare the stand-by heating chamber 28 for a third soaking step.

In step S7 implemented after the counter N is incremented to "2", the temperature in the first heating chamber 28 is controlled to the third target temperature $KT_3$ which is lower by a value $2\Delta KT$ than the first target temperature $KT_1$ which was established in the first soaking step. Therefore, it takes a comparatively long time for the temperature in the first heating chamber 28 to be lowered from the first target temperature $KT_1$ down to the third target temperature $KT_2$. To lower the temperature to the third target value $KT_3$ in a shorter time, cooling air is initially delivered from the cooling tubes 58 in the first vacuum chamber 52 to lower the temperature in the heating chamber 28 to a level lower than the third target temperature $KT_3$, and then the appropriate heaters H are feed-back controlled to raise the temperature to the third target temperature $KT_3$. Thus, the stand-by step performed in step S7 to control the temperature in the stand-by heating chamber 28 consists of an initial cooling step to lower the temperature to a level lower than the target value $KT_3$ by a suitable value, and a subsequent temperature raising and holding step to hold the temperature at the third target value $KT^3$.

When an affirmative decision (YES) is obtained in step S8 during repeated implementation of steps S6–S8, the control flow goes to step S9 (feeding step) in which the intermediate shutter device 24 is operated to move the shutter member 40 to its upper open position, and the endless belt 18 is operated to feed the substrate 62 from the second heating chamber 30 into the first heating chamber 28 which has been the stand-by heating chamber and will function as the operating heating chamber. The shutter member 40 is then moved to its lower closed position. This point of time is indicated at t4 in FIG. 8.

Then, the control flow goes to step S10 to determine whether the content of the counter N is equal to "6". Steps S5–S10 are repeatedly implemented until the affirmative decision (YES) is obtained in step S10, that is, until the temperature in the operating heating chamber is maintained at a predetermined sixth target value $KT_6$ for a sixth holding time $HT_6$. Thus, the substrate 62 is moved heat-treated alternately in the first and second heating chambers 28, 30 in an initial portion of the cooling period, which initial portion consists of the first through sixth soaking steps (temperature equalizing steps) for establishing even distribution of the temperature throughout the entire mass of the substrate 62. In these six soaking steps, the substrate 62 is sequentially held at the respective target temperature values $KT_1$, $KT_2$, $KT_3$, $KT_4$, $KT_5$ and $KT_6$ for the respective holding times $HT_1$, $HT_2$, $HT_3$, $HT_4$, $HT_5$ and $HT_6$. The temperature values $KT_1$, $KT_2$, $KT_3$, $KT_4$, $KT_5$ and $KT_6$ decrease in the predetermined increment $\Delta KT$. In this respect, it is noted that the temperature distribution of the substrate 62 has a comparatively large influence on the strain and melting state of the glass component in the substrate in the initial portion of the cooling period. When the affirmative decision (YES) is obtained in step S10 at a point of time t8 indicated in FIG. 8, the control flow goes to step S11 to turn off the heaters H.

Then, the control flow goes to step S12 to determine whether the cooling of the substrate 62 is completed. This determination is effected on the basis of the temperature in the second heating chamber 30 in which the substrate 62 is accommodated at that time. The substrate 62 is kept in the second heating chamber 30 until an affirmative decision (YES) is obtained in step S12. When the affirmative decision is obtained in step S12, step S13 is implemented to activate the outlet end shutter device 26 to move the shutter member 42 to its upper open position, and the endless belt 18 is operated to move the substrate 62 out of the second heating chamber 30.

In the present embodiment described above, the substrate 62 having a film-forming composition thereon is uniformly heated for the predetermined first holding time $HT_1$ in the first soaking step of the cooling period, in the first heating chamber 28 which is held at the first target temperature $KT_1$. In the next feeding step, the substrate 62 is fed into the second heating chamber 30 which is held at the second target temperature $KT_2$ which is lower by the predetermined decrement value 66 KT than the first target temperature $KT_1$. In the next second soaking step, the substrate 62 is uniformly heat-treated at the second target temperature $KT_2$ for the second holding time $HT_2$. Thus, the substrate 62 is alternately placed in the first and second heating chambers 28, 30 and cooled at the temperatures which decrease in steps with the predetermined decrement of $\Delta KT$. Accordingly, the local variation of the temperature within the substrate 62 is minimized. Where the substrate 62 is made of a glass material, the local dimensional variation of the substrate 62 and consequent misalignment of printed thick films are prevented, resulting in a considerable increase in the yield ratio of the product. In particular, the present invention is effective for the substrate 62 made of soda-line glass. Where the substrate 62 has a multiplicity of thick-film resistors and rib walls printed on its surface, the glass component contained in these printed thick films and functioning as a bonding agent is uniformly or evenly melted or fused since the variation in the temperature within the substrate 62 is minimized. Thus, the present arrangement is suitable for reducing a variation in the resistance of the thick-film resistors and a variation in the height dimension of the rib walls.

Further, the present embodiment makes it possible to use an inexpensive soda-lime glass for the substrate 62 for a large-sized electronic device, so that the cost of manufacture of the substrate 62 can be made considerably lower than where a glass having a high strain point is used. In addition, the use of soda-lime glass is effective to prevent chipping of the substrate during handling thereof due to a difference of its hardness from those of the thick films formed thereon, and cracking of the substrate during firing thereof due to a difference of its thermal expansion coefficient from those of the thick films.

It is also noted that the present shuttle type or two-chamber time firing apparatus 10 has only the first and second heating chambers 28, 30 in which the substrate 62 is alternately placed for heat treatment thereof. This arrangement is advantageous in that the longitudinal size of the apparatus 10 is significantly reduced. A one-way feeding type firing apparatus has a length as large as about 50 meters, for example, if this apparatus is adapted to slowly cool the substrate so as to prevent local dimensional variation of the substrate as in the present firing apparatus 10. On the other hand, the length of the present two-chamber type firing apparatus 10 is as small as one-fifth of the length of the continuous type firing apparatus.

In the present embodiment, the shutter devices 22, 24, 26 have respective movable partition walls in the form of the shutter members 38, 40, 42, which are opened only when the substrate 62 is moved into and from the first and second heating chambers 28, 30 and which are closed to secure gas tightness of the chambers 28, 30 while these chambers are operating as the operating and stand-by heating chambers. Accordingly, the temperatures within these heating chambers 28, 30 are evenly distributed, making it possible to further reduce a variation in the temperature within the substrate 62.

Other embodiments of this invention will be described. In these embodiments, the same reference signs as used in the first embodiment will be used to identify the functionally corresponding elements, and redundant description of these elements will not be provided.

Figure 10:
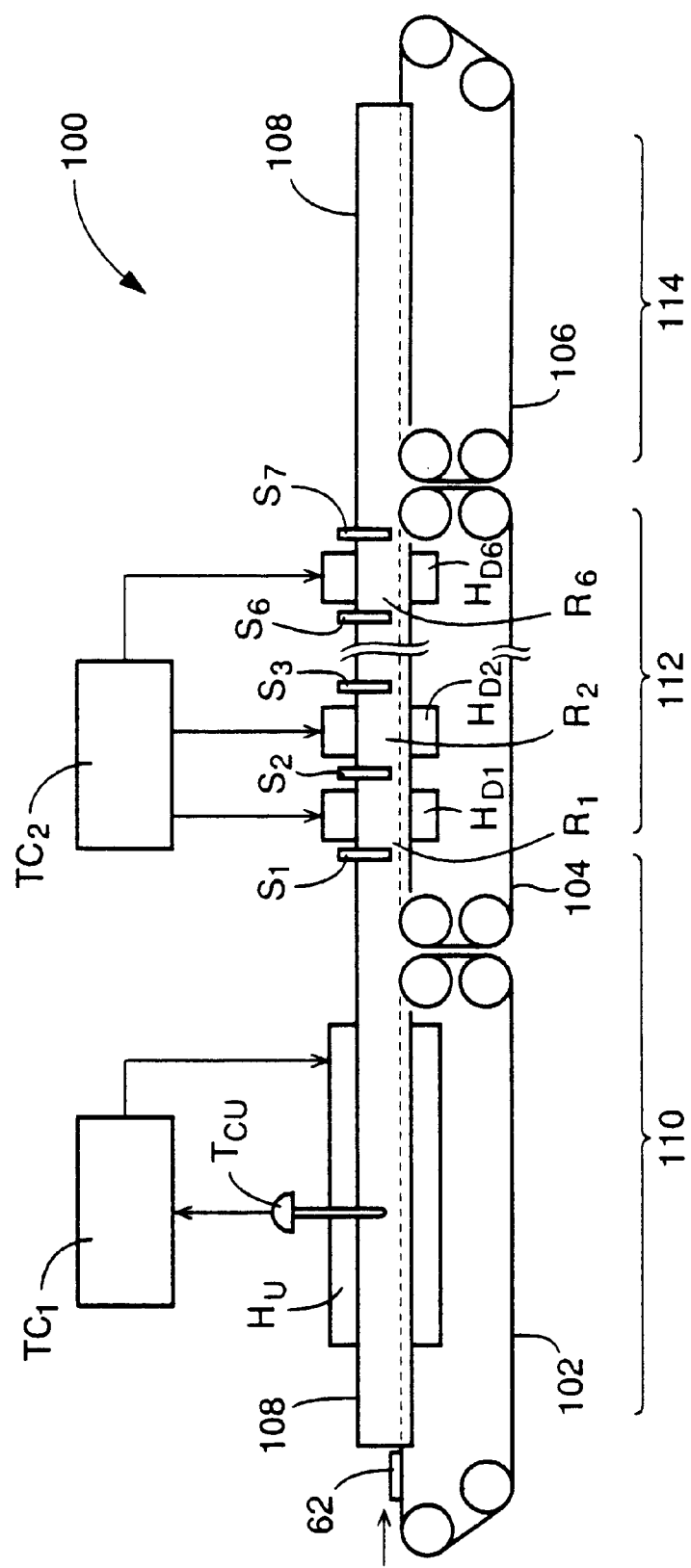
FIG. 10 is a schematic view showing an arrangement of a continuous type firing apparatus constructed according to another embodiment of this invention.

Referring to the schematic view of FIG. 10, there is shown a one-way feeding type firing apparatus 100 adapted to feed the substrate 62 continuously in one direction. The present firing apparatus 100 is provided with a first belt conveyor 102, a second belt conveyor 104 and a third belt conveyor 106, which are operated independently of each other and disposed in series. The substrate 62 is fed by these first, second and third belt conveyors 102, 104, 106 in the feeding direction through a tunnel type furnace 108.

The tunnel type furnace 108 has a heating zone 110 in which the substrate 62 is heated to the highest temperature, a gradually cooling zone 112 in which the substrate 62 is gradually or slowly cooled, and a cooling zone 114 in which the substrate 62 is cooled by indirect air cooling to a level near the ambient or room temperature. The heating zone 110 is provided with a temperature detector $T_{CU}$ for detecting the temperature in the heating zone 110, a heater $H_U$ for raising the temperature in the heating zone 110, and a first temperature control device $T_{C^1}$ for controlling the temperature in the heating zone 110, according to a temperature raising pattern as indicated at A in FIG. 8.

The gradually cooling zone 112 includes shutter devices $S_1$–$S_7$ for dividing it into a plurality of heating chambers, more specifically, first through sixth heating chambers $R_1$–$R_6$. The gradually cooling zone 112 further includes temperature detectors $T_{C^1}$–$T_{C^6}$ for detecting the temperatures in the heating chambers $R_1$–$R_6$, heaters $H_{D^1}$–$H_{D^6}$ for heating the heating chambers $R_1$–$R_6$, and a temperature control device $T_{C^2}$ for controlling the temperatures in the heating chambers $R_1$–$R_6$ to respective first through sixth target temperatures $KT_1$–$KT_6$.

In the present one-way feeding type firing apparatus 100 constructed as described above, the temperature of the substrate 62 is raised according to the temperature raising pattern as indicated at A in FIG. 8 while the substrate 62 is continuously fed by the first belt conveyor 102 through the heating zone 110. The second belt conveyor 104 is operated under the control of a drive control device not shown, such that the substrate 62 which has been fed by the first belt conveyor 102 is intermittently fed through the first through sixth heating chambers $R_1$–$R_6$ which are held at the respective first through sixth target temperatures $KT_1$–$KT_6$, so that the temperature of the substrate 62 is gradually lowered to the sixth target temperature $KT_6$, with even distribution of the temperature within the substrate 62 in each heating chamber R. The substrate 62 is then fed from the sixth heating chamber $R_6$ onto the third belt conveyor 106.

As a result, the substrate 62 is gradually cooled as it is fed by the second belt conveyor 104 through the gradually cooling zone 112, with the substrate 62 being held at the respective first through sixth target temperatures $KT_1$–$KT_6$ in the first through sixth heading chambers $R_1$–$R_6$, for the predetermined holding time HT in each heating chamber R. The substrate 62 is then cooled down to a level near the ambient temperature while it is continuously fed through the cooling zone 114 by the third belt conveyor 106. Thus, the substrate 62 is cooled with its temperature being lowered initially in steps and then continuously at a given rate, as indicated in FIG. 8.

In the present second embodiment, too, the substrate 62 having a film-forming composition provided thereon is cooled, first in the first soaking step in the first heating chamber $R_1$ for the predetermined holding time -HT while the temperature in the first heating chamber $R_1$ is maintained at the first target temperature $KT_1$. In the next feeding step, the substrate 62 is fed into the second heating chamber $R_2$ which is held at the second target temperature $KT_2$ lower than the first target temperature $KT_1$ by the predetermined decrement $\Delta KT$. In the next second temperature holding step, the substrate 62 is held in the second heating chamber $R_2$ for the holding time HT. Then, the substrate 62 is fed into the third through sixth heating chambers $R_3$–$R_6$ whose temperatures decrease in steps with the predetermined increment $\Delta KT$. Accordingly, the local variation of the temperature within the substrate 62 is minimized. Where the substrate 62 is made of a glass material, the local dimensional variation of the substrate 62 and consequent misalignment of printed thick films are prevented, resulting in a considerable increase in the yield ratio of the product. Where the substrate 62 has a multiplicity of thick-film resistors and rib walls printed on its surface, the glass component contained in these printed thick films and functioning as a bonding agent is uniformly or evenly melted or fused since the variation in the temperature within the substrate 62 is minimized. Thus, the present arrangement is suitable for reducing a variation in the resistance of the thick-film resistors and a variation in the height dimension of the rib walls.

In the present embodiment, the substrate 62 is heat-treated for even temperature distribution while it is intermittently fed in one direction by the second belt conveyor 104 through the first through sixth heating chambers $R_1$–$R_6$. Accordingly, the overall length of the present firing apparatus 100 can be made smaller than that of a conventional continuous feeding type firing apparatus which is adapted to continuously feed the substrate so as to cool the temperature of the substrate according to a continuous temperature cooling pattern that permits the substrate to have an extremely reduced local temperature variation. Since the present apparatus 100 does not have a stand-by heating chamber as provided in the two-chamber type apparatus 10, the apparatus 100 provides an accordingly increased degree of heat treating efficiency and is suitable for mass production of a product using the substrate 62.

Figure 11:
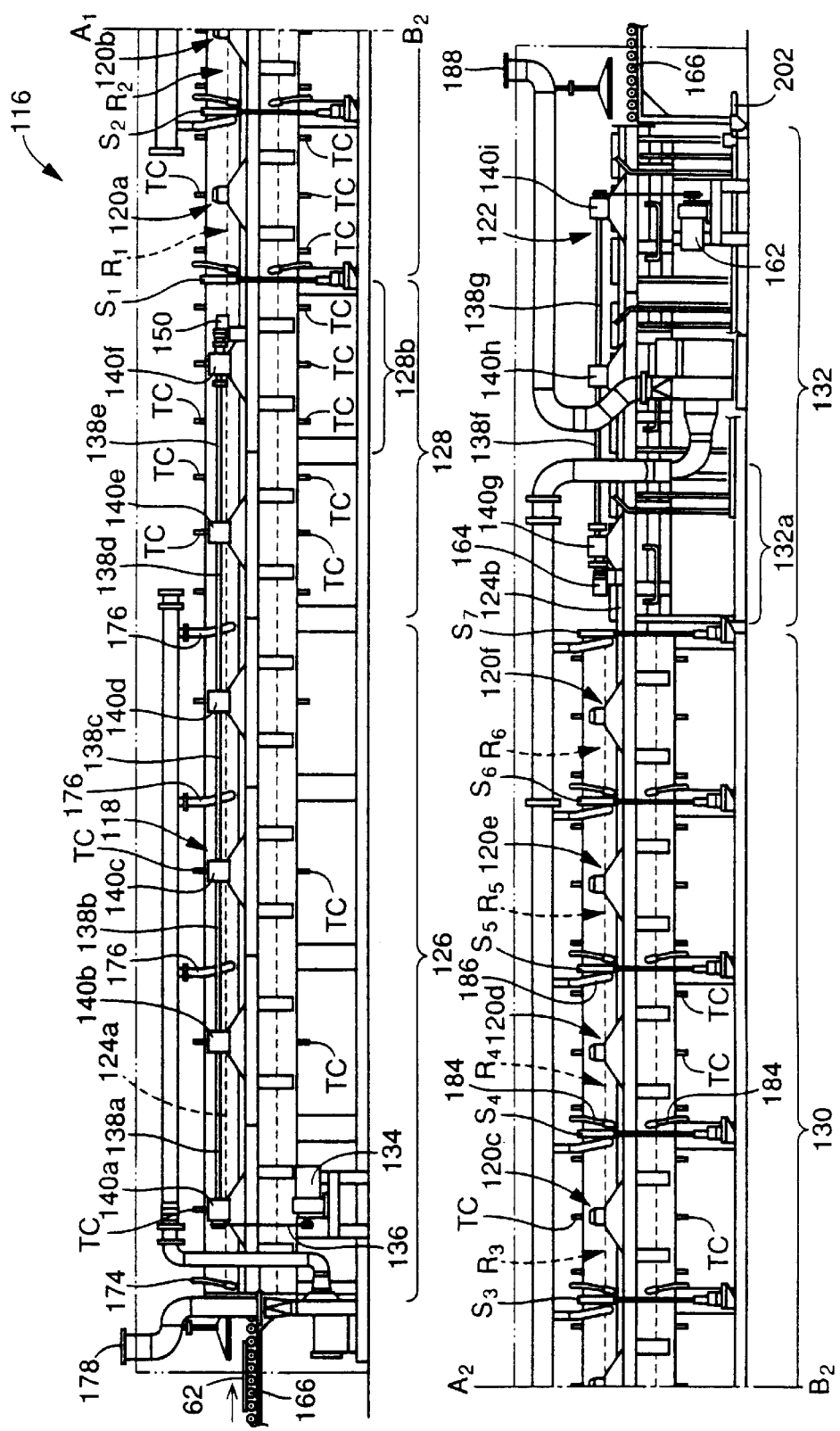
FIG. 11 is a view showing an overall arrangement of a continuous type firing apparatus constructed according to a further embodiment of this invention.

Referring to the schematic view of FIG. 11, there is shown another one-way feeding type firing apparatus 116 adapted to fire the substrate 62 in one direction. The present firing apparatus 116 includes a first conveyor device 118, a plurality of second conveyor devices 120a–120f, and a third conveyor device 122, which are operated independently of each other and disposed in series to feed the substrate 62 in the predetermined feeding direction through tunnel type furnaces 124a and 124b.

Each of the tunnel type furnaces 124 has an inner wall which is made of a refractory glass such as crystallized glass containing β-spodumene. The furnace 124 has a pre-heating zone 126, a heating zone 128, a gradually cooling zone 130, and a cooling zone 132. The pre-heating zone 126 is provided for heating the substrate 62 to the highest temperature (heat-treatment temperature) and removing or burning off, in this heating step, a binder (resin) contained in the films printed on the substrate 62. The heating zone 128 is for maintaining the substrate 62 at the highest temperature for a predetermined time. The gradually cooling zone 130 is for gradually cooling the substrate 62, while the cooling zone 132 is for cooling the substrate 62 down to a level near the ambient temperature.

The first conveyor device 118 is provided extending through the pre-heating zone 126 and the heating zone 128. This first conveyor device 118 includes a motor 134 with a speed reducer disposed below the furnace 124a, a chain 136, a plurality of line shafts 138a–138e disposed in a line, and a plurality of miter gears 140a–140f each disposed between the appropriate adjacent ones of the line shafts 139. A rotary motion of the motor 134 is transmitted to the substrate 62 for continuously feeding the substrate 62 through divisions of the furnace 124, which are arranged in the longitudinal direction of the furnace 124.

Figure 12A:
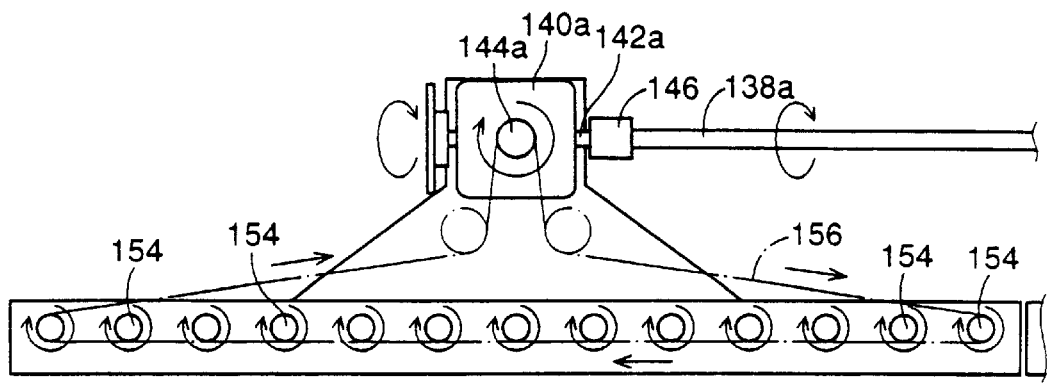
FIGS. 12(a)–12(c) are views showing conveyor devices used in the embodiment of FIG. 11.
Figure 12B:
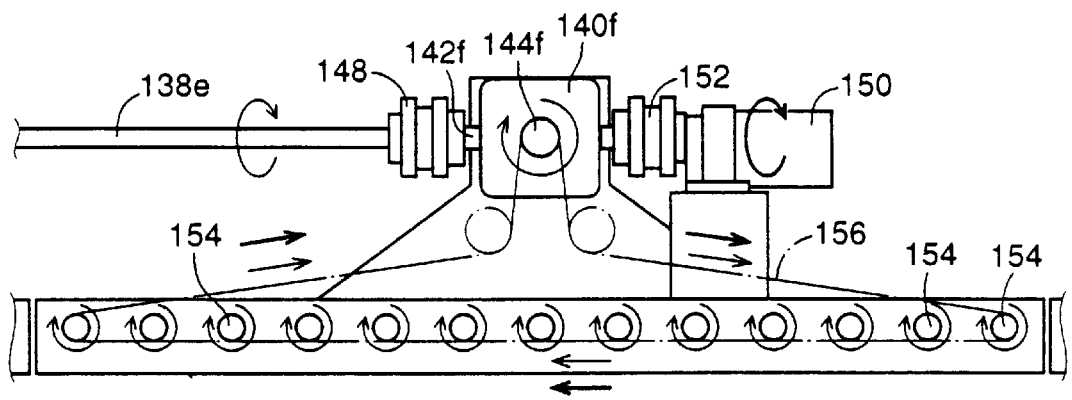
Figure 12C:
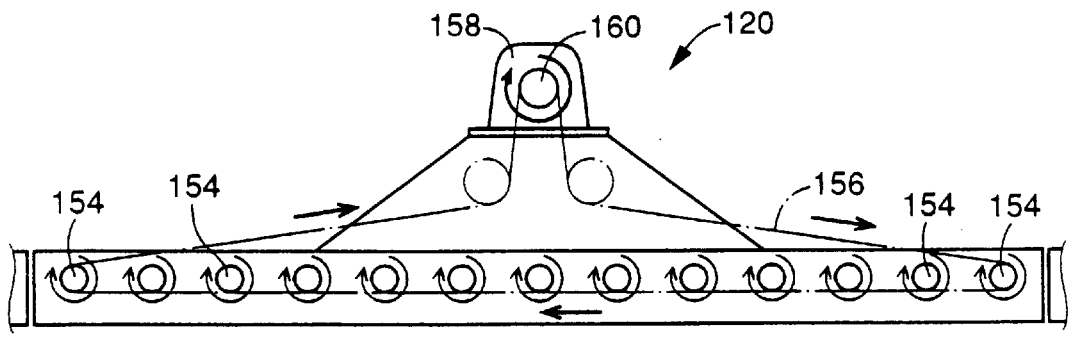

FIGS. 12(a) and 12(b) show in enlargement end portions of the first conveyor device 118, and FIG. 12(c) shows a part of the second conveyor device 120. As shown i FIGS. 12(a) and 12(b), the miter gear 140a of the first conveyor device 118 has a driving shaft 142a whose axis extends in the longitudinal direction of the furnace 124, and further has a driven shaft 144a whose axis extends in a direction perpendicular to the longitudinal direction of the furnace 124. Namely, the axis of the driven shaft 144a is perpendicular to the plane of the sheet of FIG. 12(a). The rotary motion of the motor 134 is transmitted to the miter gear 140a through the chain 136, so that the driving shaft 142a is rotated in the direction indicated by arrows in FIG. 12(a), whereby the line shaft 138a connected to the driving shaft 142a through a coupling 146 is rotated in the same direction as the driving shaft 142a, while at the same time the driven shaft 144a is rotated in the direction indicated by arrows in FIG. 12(a). It is noted that the line shafts 138b–138e are connected to the respective miter gears 140b–140e through respective couplings (not shown) similar to the coupling 140.

The miter gear 140f shown in FIG. 12(b) is disposed at the right end of the first conveyor device 118 as shown in FIG. 11. The driving shaft 142f is connected at one end thereof to the line shaft 138e through a one-way coupling 148. At the other end of the driving shaft 142f, there is provided a motor 150 with a speed reducer, which is connected to that other end of the driving shaft 142f through a one-way coupling 152. These one-way couplings 148, 152 are adapted to transmit rotary motions of the line shaft 138e and motor 150 only in the direction indicated by arrows in FIG. 12(b). As described below, the motor 150 is operated intermittently at a higher speed than the line shaft 138, in synchronization with the second conveyor device 120. In this arrangement, a rotary motion of the line shaft 138e is transmitted to the driving shaft 142f through the one-way coupling 148 when the motor 150 is at rest. When the motor 150 is in operation, the rotary motion of the line shaft 138e is transmitted to the driving shaft 142f through the one-way coupling 152, with the one-way coupling 148 held in a slipping state.

Below the plurality of miter gears 140, there are disposed a plurality of rotary shafts 154 whose axes extend in parallel with each other in the direction perpendicular to the longitudinal direction of the furnace 124. These rotary shafts 154 are arranged in the longitudinal direction of the furnace 124. Thus, the first conveyor device 118 is provided with multiple rotary shafts 154 arranged in the longitudinal direction of the furnace 124 over the entire length. The rotary motion of the driven shaft 144 is transmitted to the rotary shafts 154 through a chain (or timing belt) 156 so that the rotary shafts 154 are rotated in the direction indicated by arrow. When the motor 134 is operated, the multiple rotary shafts 154 of the first conveyor device 118 arranged in the longitudinal direction of the furnace 124 are concurrently rotated at the same speed in the same direction. When the motor 150 is operated, the rotary motion of the motor 150 is transmitted to the miter gear 140f, and the miter gear 140f is substantially disconnected from the line shaft 138f by the one-way coupling 148, whereby the rotary shafts 154 disposed below the miter gear 140f, that is, the rotary shafts 154 in a half area 128b of the heating zone 128 on the side of the gradually cooling zone 130 are rotated at a higher speed that the other rotary shafts 154 of the first conveyor device 118. In the present embodiment, the heating zone area 128b through which the substrate 62 is fed by the miter gear 140f and which is adjacent to the gradually cooling zone 130 is an area in which the feeding speed of the substrate 62 is changed. Further, the motor 150 and the one-way couplings 148, 150 function as a device for changing the feeding speed of the substrate 62.

Each of the plurality of second conveyor devices 120 is equipped with a motor 150 with a speed reducer, as shown in FIG. 12(c). The motors 150 of the second conveyor devices 120 are operated intermittently independently of each other. As in the first conveyor device 118, a plurality of rotary shafts 154 are disposed below the motor 158 such that the axes of the rotary shafts 154 are perpendicular to the longitudinal direction of the furnace 124. These rotary shafts 154 are connected to an output shaft 160 of the motor 158 through a chain 156, and are rotated in the same direction by the motor 158. Thus, the plurality of second conveyor devices 120 use the independently operated motors 158, in place of the miter gears 140 rotated by the motor 134 in the first conveyor device 118. As is apparent from FIG. 11, the third conveyor device 122 include the miter gears 140 the number of which is smaller than that in the first conveyor device 118. Further, the arrangement of the third conveyor device 122 is reversed with respect to the first conveyor device 118, in the longitudinal direction of the furnace 124. The third conveyor device 122 includes a motor 162 with a speed reducer disposed below the furnace 124b. A rotary motion of the motor 162 is transmitted to miter gears 140g, 140h, 140i and line shafts 138f, 138g. The miter gear 140g has the same construction as the miter gear 140f. A rotary motion of a motor 164 with a speed reducer is transmitted to the miter gear 140g through a one-way coupling, so that the rotary shafts 154 corresponding to the miter gear 140g are intermittently rotated at a higher speed than the other rotary shafts 154, that is, at a speed synchronous with the second conveyor devices 120. Accordingly, a half area 132a of the cooling zone 132 through which the substrate 62 is fed by the miter gear 140g and which is adjacent to the gradually cooling zone 130 is an area in which the feeding speed of the substrate 62 is changed. The motor 164 constitutes a part of a device for changing the feeding speed in the area 132a.

Figure 13:
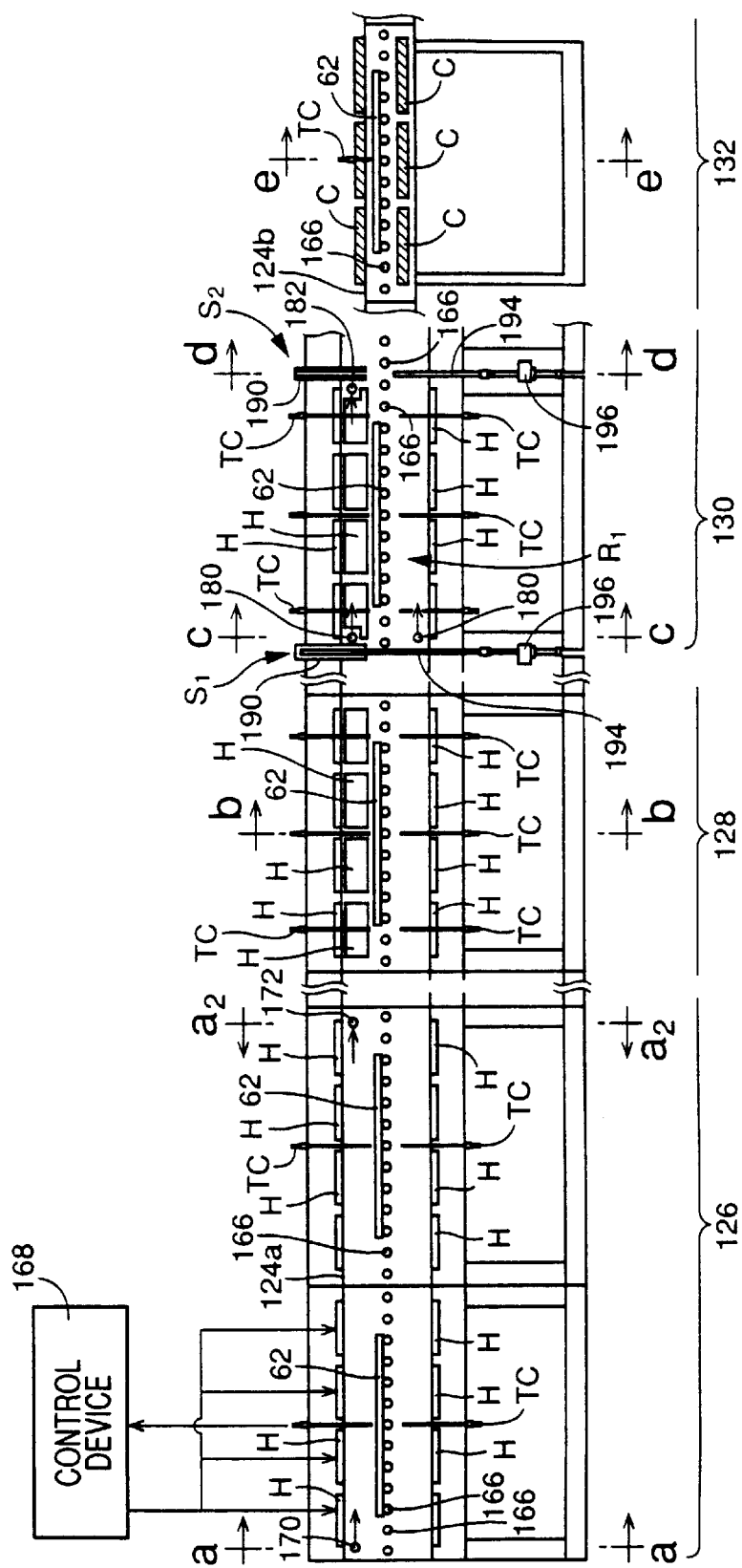
FIG. 13 is a view partly in longitudinal cross section of the furnace in the embodiment of FIG. 11.

Referring to FIG. 13, there is shown the furnace 124 in longitudinal cross section taken at a widthwise middle portion thereof, with some longitudinal portions thereof being omitted. In the furnace 124, there are disposed a plurality of rollers 166 made of alumina, for example. As shown in the cross sectional views of FIGS. 14(a)–14(e) taken along lines a—a through e—e of FIG. 13, each roller 166 extends through the furnace 124 in the width direction and is supported at its opposite end portions by the furnace 124. While FIG. 14(*a*) is the cross sectional view taken along line a—a of FIG. 13, a cross sectional view taken along line a2—a2 of FIG. 13 is the same as FIG. 14(*a*). The substrate 62 indicted above is placed on the rollers 166 in the furnace 124. When the rollers 166 are rotated, the substrate 62 is fed in one direction. The rollers 166 are connected to the rotary shafts 154 coaxially therewith, for simultaneous rotation therewith. The rollers 166 provided in the first and third conveyor devices 118, 122 in the pre-heating zone 126, heating zone 128 and cooling zone 132 are rotated continuously to feed the substrate 62 continuously. On the other hand, the rollers 166 provided in the second conveyor devices 120 in the gradually cooling zone 130 are rotated intermittently to feed the substrate intermittently. In the present embodiment, therefore, the first and third conveyor devices 118, 122 constitute a continuously feeding device, while the second conveyor devices 120 constitute an intermittently feeding device.

Figure 14:
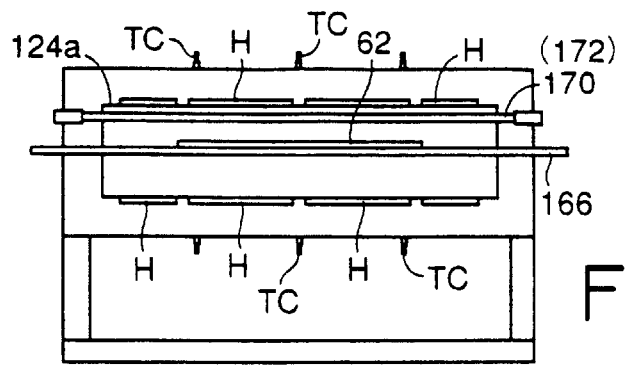
FIGS. 14(a), 14(b), 14(c), 14(d) and 14(e) are cross sectional views taken along lines a—a, b—b, c—c, d—d and e—e of FIG. 13, respectively.
Figure 14:
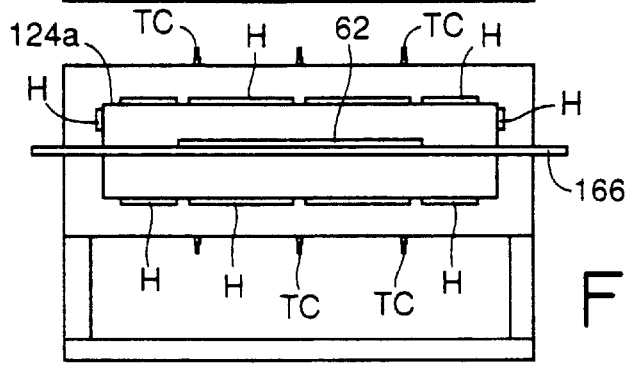
Figure 14:
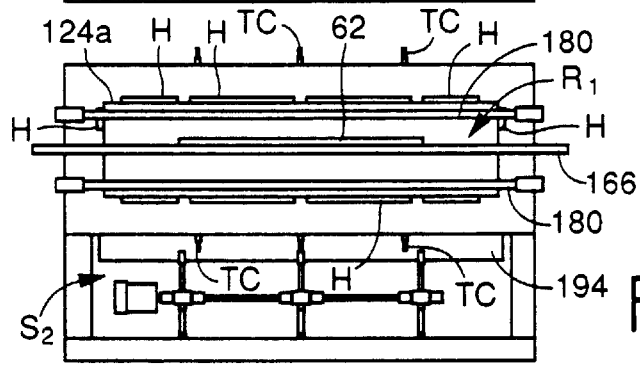
Figure 14:
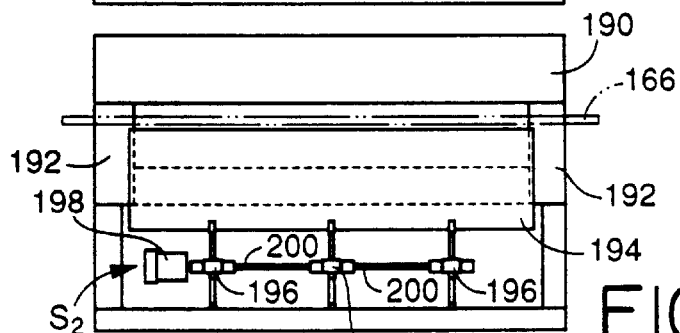
Figure 14:
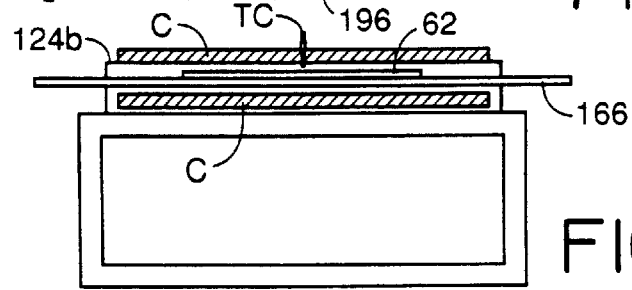

It will be understood from FIGS. 11, 13 and 14 that a plurality of temperature detectors TC are provided in the pre-heating zone 126 to detect the temperatures in the pre-heating zone 126. Described more specifically, three temperature detectors TC are disposed on each of the upper and lower sides of the furnace 124 in each of longitudinal divisions of the pre-heating zone 126 which corresponds to the miter gears 140. The three temperature detectors TC are located at a longitudinally middle portion of each longitudinal division and arranged in the width direction of the pre-heating zone 126. Further, a plurality of heaters H are disposed on each of the upper and lower sides of the furnace 124, for each of the longitudinal divisions of the pre-heating zone 126. The heaters H are disposed in a matrix defined by four columns parallel to the longitudinal direction and four rows parallel to the width direction. The output signals of the temperature detectors TC are fed to a control device 168, as shown in FIG. 13 by way of example in connection with the set of upper temperature detectors TC and the set of upper heaters H in the inlet end portion of the pre-heating zone 126. Based on the output signals of the temperature detectors TC, the control device 168 controls the heaters H so as to raise the temperature in the pre-heating zone 126 according to a temperature raising pattern as indicated at A in FIG. 8, while the substrate 62 is fed through the pre-heating zone 126. The pre-heating zone 126 is further provided with an intake pipe 170 at the inlet end of the furnace 124, and exhaust pipes 170 in the above-indicated longitudinal divisions except the inlet end division in which the intake pipe 170 is provided. Each exhaust pipe 170 is located at the upstream or leading end of the appropriate longitudinal division as seen in the feeding direction of the substrate 62. The intake pipe 170 is connected to an inlet conduit provided on the side surface of the furnace 124, for supplying air from an air source (not shown) into the furnace 124. The exhaust pipes 172 are connected to exhaust conduits 176 provided on the side surface of the furnace 124, for discharging the air from the furnace 124 while the air flows through the furnace 124. The intake pipe 170 and exhaust pipes 172 have nozzles similar to the nozzle 57 of the cooling tubes 58, in their portions located within the furnace 124. The nozzles of the exhaust pipes 172 may be elongate holes extending in the longitudinal direction of the pipes, for improving the air exhausting efficiency.

In the heating zone 128, too, a plurality of temperature detectors TC are provided to detect the temperatures in the heating zone 128. Namely, nine temperature detectors TC are disposed on each of the upper and lower sides of the furnace 124 in each of longitudinal divisions of the heating zone 128, which divisions are similar to those of the pre-heating zone 126. These nine temperature detectors TC are disposed in a matrix defined by three columns and three rows parallel to the longitudinal and width directions of the furnace 124. Further, heaters H are disposed on the upper and lower surfaces and an upper portion of each of the opposite side surfaces of the furnace 124, in each of the longitudinal divisions. The heaters H on the upper and lower surfaces in each longitudinal division of the furnace 124 are disposed in a matrix defined by four columns and four rows parallel to the longitudinal and width directions of the furnace 124. The heaters H on each side surface of the furnace 124 consist of four heaters disposed in a row in the longitudinal direction. The temperature detectors TC and heaters H provided in the heating zone 128 are also connected to the control device 168, so that the heaters H are controlled based on the output signals of the temperature detectors TC, so as to maintain the temperature in the heating zone 128 as indicated at HT in FIG. 8, while the substrate 62 is fed through the heating zone 128.

The gradually cooling zone 130 includes shutter devices $S_1$–$S_7$ for dividing the zone 130 into six heating chambers $R_1$–$R_6$, temperature detectors TC for detecting the temperatures in the heating chambers $R_1$–$R_6$, and a set of heaters H for each of the heating chambers $R_1$–$R_6$. As in the heating zone 128, the heaters H for each heating chamber R are provided on the upper and lower surfaces and an upper portion of each side surface of the furnace 124. The gradually cooling zone 130 further includes upper and lower intake pipes 180 provided at the downstream or trailing end of each heating chamber R as seen in the feeding direction of the substrate 62, for introducing cooling air into the heating chamber R, and an exhaust pipe 182 provided at the upstream or leading end of each heating chamber R as seen in the feeding direction, for discharging the cooling air from an upper portion of the heating chamber. The intake and exhaust pipes 180, 182 are connected to external intake and exhaust conduits 184, 186, respectively, so that the cooling air is supplied from an air source into the heating chamber R through the intake pipe 180, and the air is discharged from the heating chamber R through an exhaust outlet 188. Like the intake and exhaust pipes 170, 172 in the pre-heating zone 126, the intake and exhaust pipes 180, 182 are made of alumina ceramics, and have a multiplicity of nozzles or holes. The temperature detectors TC and heaters H in the gradually cooling zone 130 are also connected to the control device 168, and the heaters H are controlled by the device 168 so that the temperatures in the six heating chambers R are controlled to $KT_1$–$KT_6$ which decrease in steps as indicted in FIG. 8. Thus, the first heating chamber $R_1$ corresponds to the first soaking step. However, the temperature in the first heating chamber $R_1$ may be controlled to $KT_2$ rather than $KT_1$.

Referring to the cross sectional view of FIG. 14(*d*) taken along line d—d of FIG. 13, there is shown the shutter device $S_2$ by way of example. Each shutter device S includes a partition plate 190, shutter guides 192, 192, a shutter 194, three small jacks 196, and a motor 198. The partition plate 190 is made of a refractory glass similar to a refractory glass of the inner wall of the furnace 124. The shutter 194 functions as a movable partition wall which is vertically moved between the rollers 166. The small jacks 196 are disposed below the furnace 124 and are driven by the motor 198 to vertically move the shutter 194. The partition plate 190 consists of two refractory glass plates which are fixed on an upper portion of the furnace 124 such that the two refractory glass plates are spaced apart from each other by a small distance corresponding to the thickness of the shutter 194. Each shutter guide 192 is provided on the side surface of the furnace 124, adjacent to the lower surface of the partition plate 190. Like the partition plate 190, the shutter guide 192 consists of two refractory glass plates which are spaced apart from each other by the small distance corresponding to the thickness of the shutter 194. Thus, the partition plate 190 has a groove formed to extend along the upper wall of the furnace 124, while the shutter guides 192 guide grooves formed to extend along the side walls of the furnace 124. These grooves have a dimension in the longitudinal direction of the furnace 124, which is almost equal to the thickness of the shutter 194. In this arrangement, the shutter 194 is vertically guided by the guide grooves of the shutter guides 192, and the upper end portion of the shutter 194 is received in the groove of the partition plate 190 when the shutter 194 is placed in its upper closed position, as indicated in FIG. 13 with respect to the shutter device $S_1$ by way of example. The two small jacks 196 are connected to each other by a drive shaft 200 and are simultaneously rotated by the motor 198.

In the cooling zone 132, temperature detectors TC for detecting the temperatures in the cooling zone are provided on the upper side of the furnace 124, in each of the longitudinal divisions of the cooling zone 132 as in the pre-heating and heating zones 126, 128. These temperature detectors TC are located in the longitudinally and widthwise middle portions of the longitudinal division of the cooling zone 132. Further, three cooling jackets C are provided on each of the upper and lower sides of the furnace, in each longitudinal division of the cooling zone 132, such that the cooling jackets C extend in the direction of width and are arranged in the longitudinal direction. The dimension of each jacket C in the direction of width of the cooling zone 132 is substantially equal to the width of the furnace 124 as indicated in FIG. 14(*e*). Cooling water supplied from a cooling water pipe 202 as shown in FIG. 11 is circulated through the cooling jackets C, and the rates of flow of the cooling water in the cooling jackets C in the individual longitudinal divisions of the cooling zone 132 are controlled by respective solenoid-operated valves. The temperature detectors TC and the solenoid-operated valves for the cooling jackets C are also connected to the control device 168, so that the valves are controlled by the control device 168 based on the output signals of the temperature detectors TC, to control the rates of flow of the cooling water through the cooling jackets C according to a temperature lowering pattern as indicated in FIG. 8, while the substrate 62 is fed through the cooling zone 132.

In the one-way feeding type firing apparatus 116 constructed as described above, the temperature in the pre-heating zone 126 is raised according to the temperature raising pattern as indicated at A in FIG. 8 while the substrate 62 is continuously fed through the pre-heating zone 126 by the first conveyor device 118, and the temperature in the heating zone 128 is maintained at the highest firing temperature $KT_1$ while the substrate 62 is continuously fed through the heating zone 128 also by the first conveyor device 118. The second conveyor devices 120 are intermittently or sequentially operated under the control of a drive control device (not shown) to feed the substrate 62 received from the first conveyor device 118 into the first heating chamber $R_1$ whose temperature is maintained at the first target value $KT_1$, and the substrate 62 is held in the first heating chamber $R_1$ so that the temperature within the substrate 62 is evenly distributed in the first soaking step. Then, the substrate 62 is sequentially introduced into the second through sixth heating chambers $R_2$–$R_6$ so that the substrate 62 is subjected to the second through sixth soaking steps at the temperatures $KT_2$–$KT_6$ which decrease in steps. Then, the substrate 62 is fed from the sixth heating chamber $R_6$ onto the third conveyor device 122.

Thus, the substrate 62 is gradually cooled with even distribution of the temperature throughout the entire mass of the substrate 62 while the substrate 62 is fed by the second conveyor devices 120 through the gradually cooling zone 130 such that the substrate 62 is held for the predetermined holding time in each of the first through sixth heating chambers $R_1$–$R_6$ whose temperatures are held at the respective first through sixth target values $KT_1$–$KT_6$. The substrate 62 is then continuously cooled down to a level near the ambient or room temperature while the substrate 62 is continuously fed by the third conveyor device 122 through the cooling zone 132. As described above, the substrate 62 whose temperature is raised to and held at the highest firing temperature $KT_1$ is cooled relatively slowly in the initial portion of the cooling period with stepwise lowering of the temperature, and relatively rapidly in the following portion of the cooling period with continuously lowering of the temperature at a suitable rate. It will be understood from the foregoing explanation of the present embodiment that the pre-heating zone 126, heating zone 128 and cooling zone 132 constitute a continuous heat treatment area in which the substrate 62 is heat-treated while it is continuously fed, and that the first and third conveyor devices 118, 122 constitute a continuously feeding device for feeding the substrate 62 continuously in one direction.

In the present third embodiment, too, the substrate 62 having a film-forming composition thereon is heat-treated for even distribution of the temperature in the first soaking step while the substrate 62 is held at the predetermined first target temperature $KT_1$ in the first heating chamber $R_1$ for the predetermined holding time HT. Then, the substrate 62 is fed in the feeding step into the second heating chamber $R_2$ whose temperature is maintained at the second target value $KT_2$ which is lower than the first target value $KT_1$ by the predetermined decrement $\Delta KT$. In this second heating chamber $R_2$, the substrate 62 is subjected to the second soaking step for the predetermined time so that the temperature within the substrate 62 is evenly distributed throughout the entire mass of the substrate. The substrate 62 is then sequentially subjected to soaking steps in the third through sixth heating chambers $R_3$–$R_6$ at the temperatures $KT_3$–$KT_6$ which decrease in steps with the decrement value $\Delta KT$, so that the temperature throughout the substrate 62 is evenly distributed in each heating chamber R while it is held therein for the predetermined time. Thus, the present embodiment is also effective to minimize a local variation in the temperature within the substrate 62. Where the substrate 62 is made of a glass material, the local dimensional variation of the substrate 62 and consequent misalignment of printed thick films are prevented, resulting in a considerable increase in the yield ratio of the product. Where the substrate 62 has a multiplicity of thick-film resistors and rib walls printed on its surface, the glass component contained in these printed thick films and functioning as a bonding agent is uniformly or evenly melted or fused since the variation in the temperature within the substrate 62 is minimized. Thus, the present arrangement is suitable for reducing a variation in the resistance of the thick-film resistors and a variation in the height dimension of the rib walls.

In the present embodiment, the substrate 62 is subjected to the soaking steps in the first through sixth heating chambers $R_1$–$R_6$ while the substrate 62 is intermittently fed in one direction by the second conveyor devices 120. Accordingly, the overall length of the present firing apparatus 116 can be made smaller than that of a conventional continuous feeding type firing apparatus which is adapted to continuously feed the substrate so as to cool the temperature of the substrate according to a continuous temperature cooling pattern that permits the substrate to have an extremely reduced local temperature variation. Since the present apparatus 116 does not have a stand-by heating chamber as provided in the two-chamber type apparatus 10, the apparatus 116 provides an accordingly increased degree of heat treating efficiency and is suitable for mass production of a product using the substrate 62.

In the present embodiment, the first conveyor device 118, second conveyor devices 120 and third conveyor device 122 include the rollers 166 which are disposed in the tunnel type furnace 124 and whose axes are parallel to each other and perpendicular to the longitudinal direction of the furnace 124. These rollers 166 are rotated about their axes to feed the substrate 62 in one direction through the furnace 124. In this arrangement wherein the substrate 62 is supported and fed in the feeding direction by the rotating rollers 166, the films formed on the substrate 62 are less likely to be adversely influenced by dust which may be considerably scattered in the furnace 124 where a conveyor belt is used to feed the substrate in the furnace. Namely, the feeding of the substrate 62 by the rotating rollers 166 is less likely to deteriorate the function of the films on the substrate 62 due to dust in the furnace 124 during the heat treatment therein. Thus, the present third embodiment uses the rollers 166 in place of the belt conveyor 102 used in the second embodiment which includes the endless belt 18 made from a mesh of refractory metal. In other words, the present firing apparatus 116 employs a so-called roller hearth kiln.

The shutter devices S used in the present embodiment include the shutters 194 which are vertically movable between the appropriate adjacent ones of the rollers 166, so as to divide the furnace 124 into the thermally insulated first through sixth heating chambers $R_1$–$R_6$. The shutters 194 are vertically movable without an interference with the rollers 166, so that the individual shutter devices S are completely independent of each other, permitting complete thermal insulation of the heating chambers R, and assuring improved uniformity of temperature in each heating chamber R and accordingly reduced local variation of the temperature within the substrate 62.

The rollers 166 of the conveyor devices 118, 120, 122 are formed of alumina ceramics, and are less likely to be worn, rusted, damaged or deteriorated due to contact with the substrate 62 and heating in the furnace 124, assuring an reduced amount of dust produced in the furnace 124 and accordingly enhanced quality of the fired substrate 62.

Further, the inner wall of the tunnel type furnace 124 and the partition plates 190, shutter guides 192 and shutters 194 of the shutter devices S are formed of a ceramic material, more specifically, a refractory glass such as β-spodumene crystallized glass. Thus, the rollers 166 and the inner wall surfaces of the furnace 124 including the inner surfaces of the heating chambers $R_1$–$R_6$ are all made of the ceramic material, and are less likely to be worn, rusted, damaged or deteriorated due to heating, assuring a further reduced amount of dust produced in the furnace 124.

The firing apparatus 116 of the present embodiment has the pre-heating zone 126, heating zone 128 and cooling zone 132 which constitute the continuous heat treatment area which is adjacent to the gradually cooling zone 130 and in which the substrate 62 is heat-treated while it is continuously fed. Further, the firing apparatus 116 includes the first and third conveyor devices 118, 122 which constitute the continuously feeding device for feeding the substrate 62 continuously in one direction at a suitable speed by rotation of the rollers 166. The continuous heat treatment area includes the areas 128b, 132a adjacent to the gradually cooling zone 130, and the first and third conveyor devices 118, 122 includes the motors 150, 164 and one-way couplings 148, 152 which constitute the feeding speed changing device for controlling the feeding speeds of the substrate 62 in the above areas 128b, 132a so that these feeding speeds are almost equal to the feeding speed in the gradually cooling zone 130.

In the above arrangement, the substrate 62 is intermittently fed through the gradually cooling zone 130, and is continuously fed at the suitable speed through the pre-heating zone 126, heating zone 128 and cooling zone 130. In the above-indicated areas 128b and 132a of the continuous heat treatment area which are adjacent to the gradually cooling zone 130, however, the rotating speed of the rollers 166 and the feeding speed of the substrate 62 are raised to that of the gradually cooling zone 130, so that the substrate 62 may be smoothly and relatively rapidly fed from the area 128b into the gradually cooling zone 130, and from this zone 130 into the area 132a, so that the times required for the substrate 62 to move between the area 128b and the zone 130 and between the zone 130 and the area 132a are shortened, making it possible to reduce the local variation of the temperature within the substrate 62 due to a difference in the temperatures between the zone 130 and the areas 128b, 132a. Further, the feeding speed changing device is effective to reduce an amount of sliding movement between the rollers 166 and the substrate 62 due to the difference in the feeding speed between the areas 128b, 132a and the zone 130 (more precisely, first and sixth heating chambers $R_1$ and $R_6$), whereby the amount of dust produced in the furnace 124 is accordingly reduced. It is also noted that the shutters 194 of the shutter devices S are placed in their open position for a time as short as possible, so as to minimize a deviation of the temperature in each heating chamber R from the target value KT and an uneven temperature distribution within each heating chamber R.

While the presently preferred embodiments of this invention have been described above by reference to the accompanying drawings, it is to be understood that the invention is not limited to the details of the illustrated embodiments, but may be otherwise embodied.

While the nine pairs of heaters H are provided in each of the first and second vacuum chambers 52, 54 corresponding to the first and second heating chambers 28, 30, a pair of relatively large heaters may be provided in each vacuum chamber 52, 54, on the upper and lower sides of the heating chamber 28, 30. In this case, the amount of heat generated by the heaters may be made larger in the peripheral portion of the heaters by increasing the density of heater windings in the peripheral portion, for example.

In the second and third embodiments of FIGS. 10 and 11, the size of each of the first through sixth heating chambers $R_1$–$R_6$ in the feeding direction may be increased so that the substrate 62 can be continuously fed by the second belt conveyor 104 or the second conveyor devices 120.

In the inlet, intermediate and outlet shutter devices 22, 24, 26 of the embodiment of FIG. 1 and the shutter devices $S_1$–$S_7$ of the embodiments of FIGS. 10 and 11, the shutter members 38., 40, 42 and the shutters 194 are vertically movable. However, the shutter devices may use stationary partition members which permanently close the heating chambers so as to permit feeding movements of the substrate 62 and assure substantial thermal insulation between the heating chambers for independent control of the temperatures within the individual heating chambers. In this case, the stationary partition members may be disposed such that their lower ends are spaced from the upper surface of the endless belt or from the rollers 166, by a distance slightly larger than the thickness of the substrate 62, so that the substrate 62 can pass through gaps between the belt or rollers and the stationary partition members of the shutter devices.

In the illustrated embodiments, the first, second and third target temperatures $KT_1$, $KT_2$ and $KT_3$ are determined to be close to the transition or strain point of a glass contained in the substrate 62 or films printed thereon, so that the temperature of the substrate 62 changes through the transition or strain point while the temperature within the substrate 62 is evenly distributed throughout the entire mass of the substrate. Where the films are bonded to the substrate 62 by melting or sintering of a metallic or inorganic material, the first, second and third target temperatures $KT_1$, $KT_2$ and $KT_3$ are determined to be close to the melting or sintering point of the metallic or inorganic material, so that the temperature of the substrate 62 changes through the melting or sintering point while the temperature within the substrate 62 is evenly distributed throughout the entire mass of the substrate.

In the first embodiment of FIG. 1, the cooling period or process includes the soaking steps wherein the second soaking step is effected at the second target temperature $KT_2$ which is lower than the first target temperature $KT_2$ by the predetermined decrement $\Delta KT$. Where the temperature raising process in which the temperature is raised is important, soaking steps may be provided also in the temperature raising process. In this case, the second target temperature $KT_2$ is higher than the first target temperature $KT_1$ by the predetermined increment $\Delta KT$.

In the third embodiment of FIG. 11, the miter gears 140 of the first and third conveyor device 118, 122 are driven by the single motor 134 or 162 through the line shafts 138. However, the miter gears 140 may be replaced by respective motors similar to the motor 158 provided in each second conveyor devices 120.

In the embodiment of FIG. 11, the feeding speed changing device including the motors 150, 164 is provided for changing the feeding speed of the substrate 62 in the areas 128b, 132a adjacent to the gradually cooling zone 130. However, the feeding speed changing device may be eliminated. In this case, the feeding speed in the area 128b, 132a is the same as that in the other area of the first or third conveyor device 118, 122.

Although the rollers 166 in the embodiment of FIG. 11 are made of alumina ceramic, they may be made of other ceramics such as mullite or spodumene. Further, the rollers 166 may be made of stainless steel (e.g., SUS310) or other metallic material having a sufficiently high heat resistance, since the rollers 166 are not subject to friction within the furnace.

It is to be understood that the prevent invention may be embodied with various other changes, modifications and improvements, which may occur to those skilled in the art, without departing from the spirit and scope of the invention defined in the following claims:

What is claimed is:

1. A firing apparatus for uniformly heat-treating a substrate having a film-forming composition thereon, comprising:

shutter devices which partially define a first and a second heating chamber such that said first and second heating chambers are thermally insulated from each other;

a heating device for controlling temperatures in said first and second heating chambers, independently of each other;

a feeding device for feeding said substrate into said first and second heating chambers alternately, so that said substrate is heat-treated in said first and second chambers alternately; and a control device for controlling said heating device to maintain the temperature in said first heating chamber at a predetermined first value while said substrate is heat-treated in said first heating chamber, and adjusting the temperature in said second heating chamber to a predetermined second value different from said predetermined first value by a predetermined difference while said substrate is heat-treated in said first heating chamber, said control device adjusting the temperature in said first heating chamber to a predetermined third value different from said predetermined second value by a predetermined difference while said substrate is heat-treated in said second heating chamber, so that said substrate is then heat-treated in said first heating chamber at said third value.

2. A firing apparatus according to claim 1, further comprising a cooling device for lowering the temperatures in said first and second heating chambers.

3. A firing apparatus according to claim 2, wherein said cooling device comprises cooling tubes for delivering cooling air into said first and second heating chambers.

4. A firing apparatus according to claim 1, wherein each of said shutter devices includes a shutter member movable between an open position and a closed position for thermal insulation of said first and second heating chambers, said movable shutter member being placed in said open position when said substrate is fed by said feeding device into or from one of said first and second heating chambers, and in said closed position while said substrate is heat-treated in one of said first and second heating chambers and while the temperature in the other of said first and second heating chambers is adjusted.

* * * * *